US009166538B2

(12) United States Patent  
Hong et al.

(10) Patent No.: US 9,166,538 B2  
(45) Date of Patent: Oct. 20, 2015

(54) INTEGRATED CIRCUIT WIRELESS COMMUNICATION UNIT AND METHOD FOR PROVIDING A POWER SUPPLY

(71) Applicant: MediaTek Singapore Pte. Ltd., Singapore (SG)

(72) Inventors: Hao-Ping Hong, Hsinchu (TW); Patrick Stanley Riehl, Cambridge, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/316,759

(22) Filed: Jun. 26, 2014

(65) Prior Publication Data

US 2014/0306763 A1    Oct. 16, 2014

Related U.S. Application Data

(63) Continuation-in-part of application No. 13/345,760, filed on Jan. 9, 2012, now Pat. No. 8,803,605.

(60) Provisional application No. 61/843,218, filed on Jul. 5, 2013, provisional application No. 61/438,347, filed on Feb. 1, 2011, provisional application No. 61/563,316, filed on Nov. 23, 2011.

(51) Int. Cl.  
*H03G 3/20* (2006.01)  
*H03F 3/04* (2006.01)  
(Continued)

(52) U.S. Cl.  
CPC .............. *H03F 3/195* (2013.01); *H03F 1/0238* (2013.01); *H03F 3/191* (2013.01);  
(Continued)

(58) Field of Classification Search  
USPC .......................................... 330/136, 297, 127  
IPC ...................................... H03G 3/20; H03F 3/04  
See application file for complete search history.

(56) References Cited

U.S. PATENT DOCUMENTS 5,764,103 A    6/1998  Burra  
6,194,941 B1   2/2001  Zarabadi  
(Continued)

FOREIGN PATENT DOCUMENTS

CN    1361938 A    7/2002  
CN    1879070 A    12/2006  
(Continued)

OTHER PUBLICATIONS

ERTL, Basic Considerations and Topologies of Switched-Mode Assisted Linear Power Amplifiers, 1996 IEEE, pp. 207-213.  
(Continued)

*Primary Examiner* — Patricia T Nguyen  
(74) *Attorney, Agent, or Firm* — Winston Hsu; Scott Margo

(57) ABSTRACT

An integrated circuit is described for providing a power supply to a radio frequency (RF) power amplifier (PA). The integrated circuit comprises a low-frequency power supply path comprising a switching regulator and a high-frequency power supply path arranged to regulate an output voltage of a combined power supply at an output port of the integrated circuit for coupling to a load. The combined power supply is provided by the low-frequency power supply path and high-frequency power supply path. The high-frequency power supply path comprises: an amplifier comprising a voltage feedback and arranged to drive a power supply signal on the high-frequency power supply path; and a high-frequency-path supply module arranged to provide a high frequency supply to drive the amplifier, where the high-frequency-path supply module comprises a pulse-width modulator operably coupled to the high frequency supply via a filter and arranged to provide a filtered pulse-width modulated signal to the high frequency supply.

27 Claims, 16 Drawing Sheets

(51) Int. Cl.
*H03F 3/195* (2006.01)
*H03F 1/02* (2006.01)
*H03F 3/191* (2006.01)

(52) U.S. Cl.
CPC .... *H03F 2200/102* (2013.01); *H03F 2200/324* (2013.01); *H03F 2200/429* (2013.01); *H03F 2200/432* (2013.01); *H03F 2200/451* (2013.01)

(56) References Cited

U.S. PATENT DOCUMENTS

| | | | |
|---|---|---|---|
| 6,316,992 B1 | 11/2001 | Miao | |
| 6,321,073 B1 | 11/2001 | Luz | |
| 6,583,664 B2 | 6/2003 | Mathe | |
| 6,590,940 B1 * | 7/2003 | Camp et al. | 375/297 |
| 6,661,210 B2 | 12/2003 | Kimball | |
| 6,825,726 B2 | 11/2004 | French | |
| 6,844,776 B2 | 1/2005 | Schell | |
| 6,934,341 B2 | 8/2005 | Sahlman | |
| 6,937,847 B2 | 8/2005 | Ehrenreich | |
| 6,984,969 B1 | 1/2006 | Liu | |
| 7,058,373 B2 | 6/2006 | Grigore | |
| 7,228,109 B2 | 6/2007 | Paulus | |
| 7,421,037 B2 | 9/2008 | Shakeshaft | |
| 7,454,238 B2 | 11/2008 | Vinayak | |
| 7,474,149 B2 | 1/2009 | Snelgrove | |
| 7,482,869 B2 | 1/2009 | Wilson | |
| 7,605,651 B2 | 10/2009 | Ripley | |
| 7,653,366 B2 | 1/2010 | Grigore | |
| 7,852,150 B1 * | 12/2010 | Arknaes-Pedersen | 330/10 |
| 7,932,780 B2 | 4/2011 | Elia | |
| 8,476,976 B2 * | 7/2013 | Wimpenny | 330/127 |
| 2002/0008574 A1 | 1/2002 | Mathe | |
| 2005/0046474 A1 | 3/2005 | Matsumoto | |
| 2005/0064830 A1 | 3/2005 | Grigore | |
| 2005/0122163 A1 | 6/2005 | Chu | |
| 2010/0250993 A1 | 9/2010 | Drogi | |
| 2011/0089921 A1 | 4/2011 | Tomita | |
| 2011/0279180 A1 * | 11/2011 | Yamanouchi et al. | 330/207 R |
| 2012/0062323 A1 | 3/2012 | Le Gallou | |
| 2012/0194274 A1 | 8/2012 | Fowers | |
| 2012/0200435 A1 | 8/2012 | Ngo | |
| 2012/0206201 A1 | 8/2012 | Mizokami | |
| 2012/0212291 A1 | 8/2012 | Wilson | |
| 2013/0200949 A1 | 8/2013 | Wilson | |
| 2013/0214858 A1 * | 8/2013 | Tournatory et al. | 330/127 |
| 2014/0065979 A1 | 3/2014 | Terry | |

FOREIGN PATENT DOCUMENTS

| | | |
|---|---|---|
| JP | H0553317 U | 7/1993 |
| JP | 200520696 A | 1/2005 |
| JP | 2005020696 A | 1/2005 |
| JP | 2005102146 A | 4/2005 |
| JP | 2007181176 A | 7/2007 |
| JP | 2007215158 A | 8/2007 |
| JP | 2010166157 A | 7/2010 |
| WO | 2006082894 A1 | 8/2006 |
| WO | 2010073941 A1 | 7/2010 |

OTHER PUBLICATIONS

Yundt, Series- or Parallel-Connected Composite Amplifiers, IEEE Transactions on Power Electronics, pp. 48-54, vol. PE-1, No. 1, Jan. 1986.

Van Der Zee, A Power Efficient Audio Amplifier Combining Switching and Linear Techniques, pp. 288-291, Solid-State Circuits Conference, 1998.

"International Search Report" mailed on May 25, 2012 for International application No. PCT/EP2012/000341, International filed: Jan. 25, 2012.

"International Search Report" mailed on Nov. 7, 2014 for International application No. PCT/US14/45322, International filed: Jul. 2, 2014.

* cited by examiner

INTEGRATED CIRCUIT WIRELESS COMMUNICATION UNIT AND METHOD FOR PROVIDING A POWER SUPPLY

CROSS REFERENCE TO RELATED APPLICATIONS

This application is a continuation-in-part of U.S. application Ser. No. 13/345,760 (filed on Jan. 9, 2012), which claims the benefit of U.S. provisional application No. 61/438,347 (filed on Feb. 1, 2011) and U.S. provisional application No. 61/563,316 (filed on Nov. 23, 2011), and this CIP application further claims the benefit of U.S. provisional application No. 61/843,218 (filed on Jul. 5, 2013). The entire contents of these related applications are incorporated herein by reference.

BACKGROUND OF THE INVENTION

1. Field of the Invention

The field of this invention relates to wireless communication units, transmitter architectures and circuits for providing a power supply. The invention is applicable to, but not limited to, power supply integrated circuits for linear transmitter and wireless communication units and a power amplifier supply voltage method therefor.

2. Description of the Prior Art

A primary focus and application of the present invention is the field of radio frequency (RF) power amplifiers capable of use in wireless telecommunication applications. Continuing pressure on the limited spectrum available for radio communication systems is forcing the development of spectrally-efficient linear modulation schemes. Since the envelopes of a number of these linear modulation schemes fluctuate, these result in the average power delivered to the antenna being significantly lower than the maximum power, leading to poor efficiency of the power amplifier. Specifically, in this field, there has been a significant amount of research effort in developing high efficiency topologies capable of providing high performances in the 'back-off' (linear) region of the power amplifier.

Linear modulation schemes require linear amplification of the modulated signal in order to minimise undesired out-of-band emissions from spectral re-growth. However, the active devices used within a typical RF amplifying device are inherently non-linear by nature. Only when a small portion of the consumed DC power is transformed into RF power, can the transfer function of the amplifying device be approximated by a straight line, i.e. as in an ideal linear amplifier case. This mode of operation provides a low efficiency of DC to RF power conversion, which is unacceptable for portable (subscriber) wireless communication units. Furthermore, the low efficiency is also recognised as being problematic for the base stations.

Furthermore, the emphasis in portable (subscriber) equipment is to increase battery life. To achieve both linearity and efficiency, so called linearisation techniques are used to improve the linearity of the more efficient amplifier classes, for example class 'AB', 'B' or 'C' amplifiers. A number and variety of linearising techniques exist, which are often used in designing linear transmitters, such as Cartesian Feedback, Feed-forward, and Adaptive Pre-distortion.

Voltages at the output of the linear, e.g. Class AB, amplifier are typically set by the requirements of the final RF power amplifier (PA) device. Generally, the minimum voltage of the PA is significantly larger than that required by the output devices of the Class AB amplifier. Hence, they are not the most efficient of amplification techniques. The efficiency of the transmitter (primarily the PA) is determined by the voltage across the output devices, as well as any excess voltage across any pull-down device components due to the minimum supply voltage (Vmin) requirement of the PA.

In order to increase the bit rate used in transmit uplink communication channels, larger constellation modulation schemes, with an amplitude modulation (AM) component are being investigated and, indeed, becoming required. These modulation schemes, such as sixteen-bit quadrature amplitude modulation (16-QAM), require linear PAs and are associated with high 'crest' factors (i.e. a degree of fluctuation) of the modulation envelope waveform. This is in contrast to the previously often-used constant envelope modulation schemes and can result in significant reduction in power efficiency and linearity.

To help overcome such efficiency and linearity issues a number of solutions have been proposed. One technique used relates to modulating the PA supply voltage to match the envelope of the radio frequency waveform being transmitted by the RF PA. Envelope modulation requires a feedback signal from the PA supply to one of the control ports of the amplifier. Proposed solutions that utilise envelope modulation include envelope elimination and restoration (EER), and envelope tracking (ET). Both of these approaches require the application of a wideband supply signal to the supply port of the PA.

It is known that the use of PA supply RF envelope tracking may improve both PA efficiency and linearity for high peak-to-average power (PAPR) high power transmit conditions. FIG. 1 illustrates a graphical representation 100 of two alternative techniques; a first technique that provides a fixed voltage supply 105 to a PA, and a second technique whereby the PA supply voltage is modulated to track the RF envelope waveform 115. In the fixed supply case, excess PA supply voltage headroom 110 is used (and thereby potentially wasted), irrespective of the nature of the modulated RF waveform being amplified. However, for example in the PA supply voltage tracking of the RF modulated envelope case 115, excess PA supply voltage headroom can be reduced 120 by modulating the RF PA supply, thereby enabling the PA supply to accurately track the instant RF envelope.

It is known that switched-mode power supply (SMPS) techniques may be used to provide improved efficiency. A SMPS is an electronic power supply that incorporates a switching regulator in order to be highly efficient in the conversion of electrical power. Like other types of power supplies, an SMPS transfers power from a source, such as a battery of a wireless communication unit, to a load, such as a power amplifier module, whilst converting voltage and current characteristics. An SMPS is usually employed to efficiently provide a regulated output voltage, typically at a level different from the input voltage. Unlike a linear power supply, the pass transistor of a switching mode supply switches very quickly between full-on and full-off states, which minimize wasted energy. Voltage regulation is provided by varying the ratio of 'on' to 'off' time. In contrast, a linear power supply must dissipate the excess voltage to regulate the output. This higher efficiency is the primary advantage of a switched-mode power supply. Switching regulators are used as replacements for the linear regulators when higher efficiency, smaller size or lighter weight power supplies are required. They are, however, more complicated, their switching currents can cause electrical noise problems if not carefully suppressed, and simple designs may have a poor power factor.

FIG. 2 illustrates graphically 200 output power 205 versus input power 210, various functional and operational advantages that can be achieved when a PA supply (drain) voltage is modulated to use an envelope tracking technique. By enabling the PA (drain) supply voltage to track the instant RF envelope 115, the PA may be kept in modest compression at constant gain 215 over the range of the amplitude modulation to amplitude modulation (AM-AM) curves 220. Such tracking of the supply voltage of the instant RF envelope 115 enables a higher output power capability 225 for the same linearity (using envelope tracking) to be achieved by the transmitter, as compared to techniques that do not allow the PA supply voltage to track the instant RF envelope of the PA. In addition, the envelope tracking graph 200 may also be viewed as being able to support a PA gain reduction when employing ET 230, as compared to an architecture that considers PA gain with a fixed supply. A skilled artisan will appreciate that this is predominantly a consequence of PA characteristics together with a function of the operation point of the PA under the chosen operating conditions for envelope tracking.

Thus, and advantageously, the gain of the PA that may be achieved when envelope tracking is implemented may be reduced 230 as compared to the PA gain that uses a fixed PA supply voltage. Envelope tracking may also support a high efficiency gain potential for high PAPR conditions. In addition, the PA may operate at a cooler temperature for the same output power, thereby reducing heat loss and increasing efficiency. However, it is also known that envelope tracking requires a high efficiency, high bandwidth supply modulator and accurate tracking of the RF envelope is therefore difficult to achieve in practical implementations.

FIG. 3 illustrates graphically 300 envelope spectral density 305 versus frequency 310 required when a PA supply (drain) voltage is modulated using an envelope tracking technique. FIG. 3 further illustrates graphically 350 a corresponding integrated amplitude modulated power 355 versus frequency 360. Envelope spectral density exhibits a number of common features for different modulation cases, for example, a low-frequency region, which contains the majority of the energy, and a high-frequency region, which must be reproduced up to, say, 4-8 MHz. As illustrated, the two energy regions are separated by a region, covering a range of roughly 10 kHz-400 kHz, which contains little energy.

Thus, a need exists for improved power supply integrated circuits, wireless communication units and methods for power amplifier supply voltage control that use such linear and efficient transmitter architectures, and in particular a wideband power supply architecture that can provide a supply voltage in a power efficient manner.

SUMMARY OF THE INVENTION

Accordingly, the invention seeks to mitigate, alleviate or eliminate one or more of the above mentioned disadvantages, either singly or in any combination. Aspects of the invention provide an integrated circuit and a wireless communication unit as described in the appended claims.

These and other aspects of the invention will be apparent from, and elucidated with reference to, the embodiments described hereinafter.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Further details, aspects and embodiments of the invention will be described, byway of example only, with reference to the drawings. Elements in the figures are illustrated for simplicity and clarity and have not necessarily been drawn to scale. Like reference numerals have been included in the respective drawings to ease understanding.

DETAILED DESCRIPTION

Figure 1:
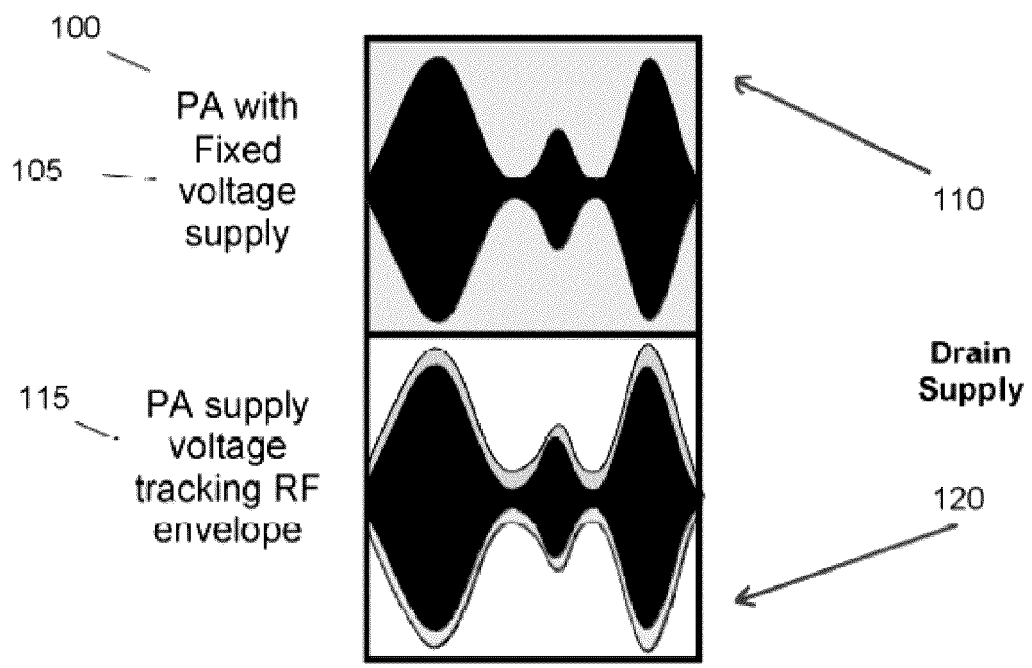
FIG. 1 illustrates a graphical representation of a first power supply technique that provides a fixed voltage supply to a PA, and a second power supply technique whereby the PA supply voltage is modulated to track the RF envelope.
Figure 2:
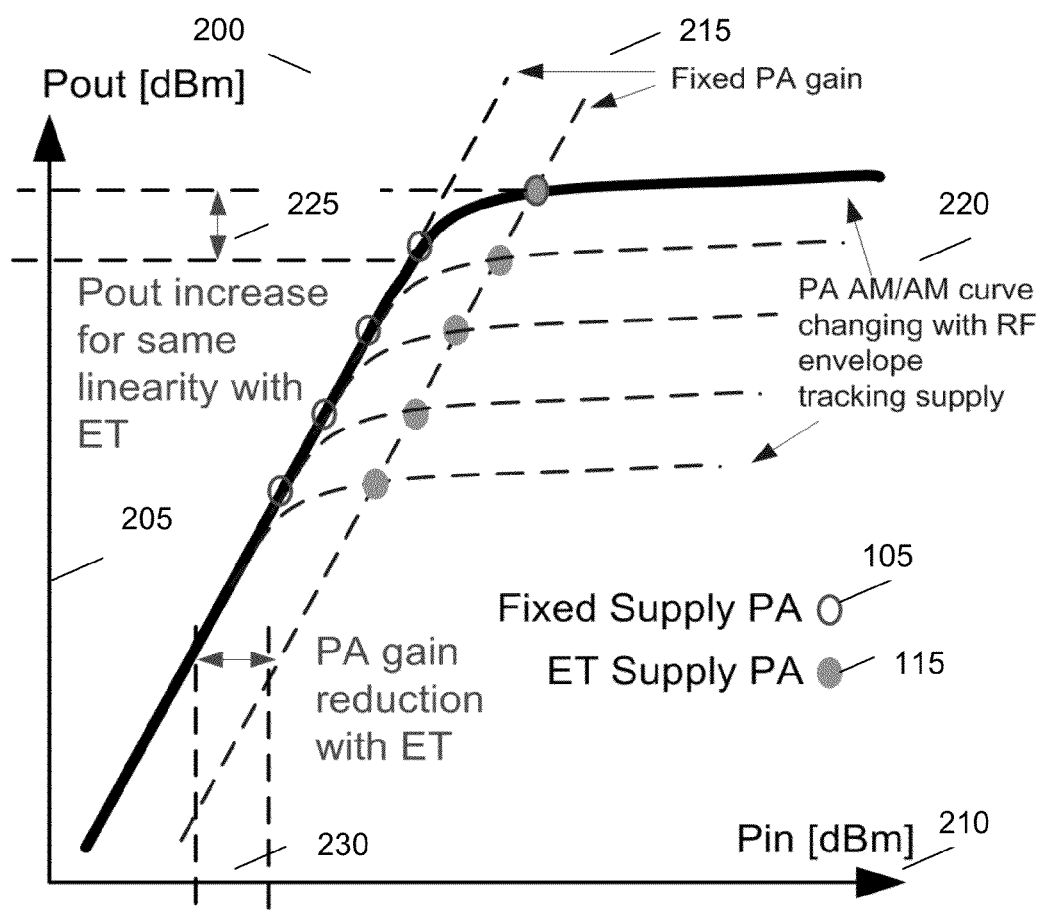
FIG. 2 illustrates graphically various functional and operational advantages that can be achieved when a PA supply (drain) voltage is modulated to use an envelope tracking technique.
Figure 3:
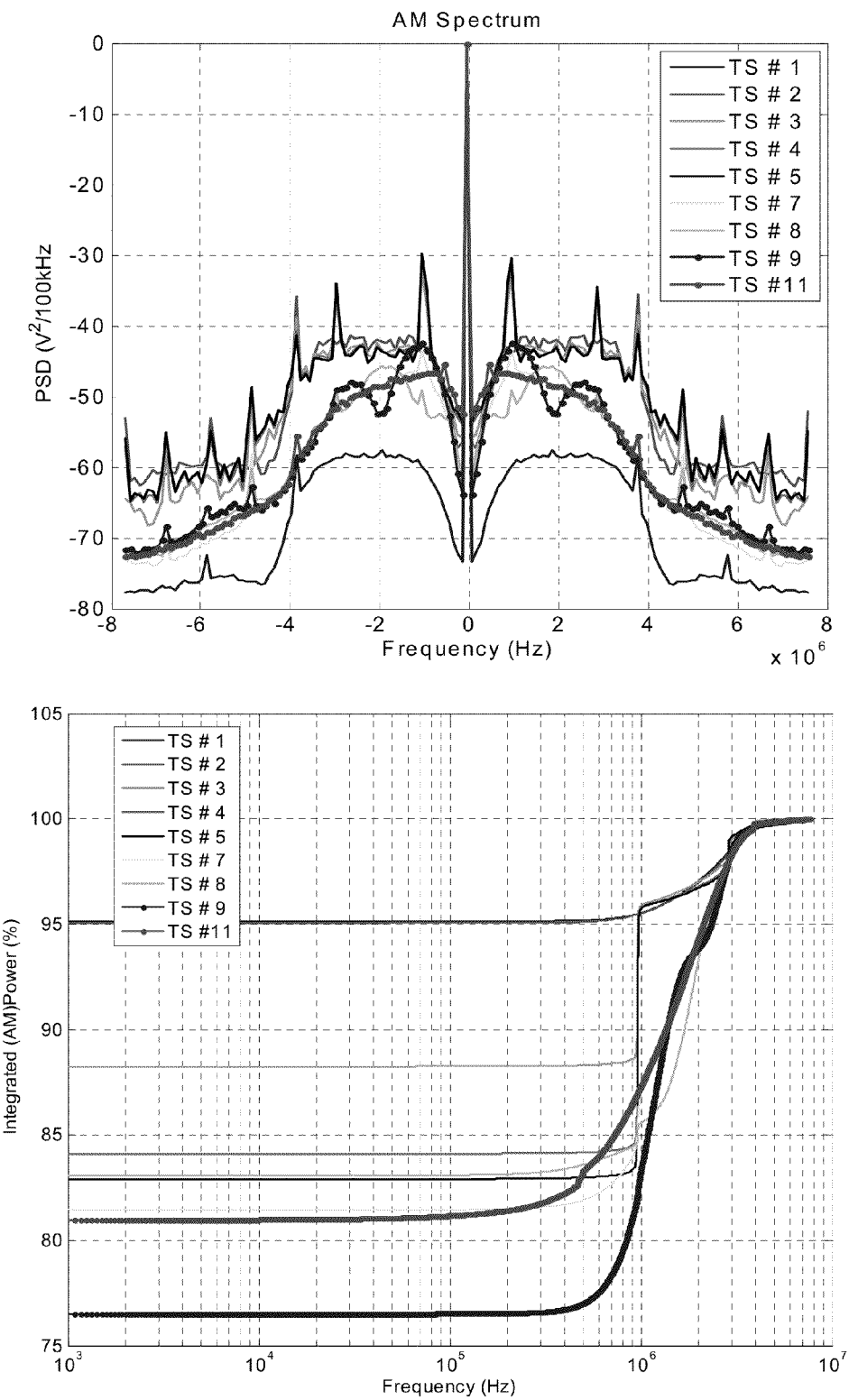
FIG. 3 illustrates graphically a power spectral density versus frequency when a PA supply (drain) voltage is modulated to use an envelope tracking technique.

Examples of the invention will be described in terms of one or more integrated circuits for use in a wireless communication unit, such as user equipment in third generation partnership project (3GPP™) parlance. However, it will be appreciated by a skilled artisan that the inventive concept herein described may be embodied in any type of integrated circuit, wireless communication unit or wireless transmitter that could benefit from improved linearity and efficiency. In some described examples of the invention, a power supply for a power amplifier, for example as part of a linear transmitter, has been adapted to support a wideband power supply that may provide improved linearity and efficiency to an RF PA. Although examples of the invention have been described with respect to an envelope tracking design, it is envisaged that the invention may be implemented in any transmitter architecture.

Furthermore, although examples of the invention have been described with respect to transmission of predominantly amplitude modulated waveforms, it is envisaged that the invention may be implemented with any waveform structures, particularly where the majority of the energy is located at frequencies close to DC.

In addition, although examples of the invention have been described with respect to a wideband linear transmitter architecture, as the efficiency benefits are most relevant to wideband systems with specific properties that allow the benefits of using efficient switch mode power supplies to supply much of the energy to be realised, it is envisaged that the invention may be also implemented in a narrowband linear transmitter architecture, such as Cartesian feedback or adaptive pre-distortion.

In some examples of the invention, a number of control mechanisms is/are provided in order to optimise a DC level of a linear amplifier (e.g. class AB amplifier) output that is used in conjunction with a switch mode power supply for a radio frequency power amplifier. With known envelope modulated/envelope tracking systems, the crest factor (peak to average ratio (PAR)) of the envelope waveform may exceed 3 dB, whereas a target amplifier output voltage setting would be of the order of less than VDD/2. In some examples of the invention, the control mechanisms described may have minimal or no additional overhead on current supplied by the linear amplifier (e.g. class AB) output. Furthermore, in some examples of the invention, the control mechanisms may have minimal or no effect on the switch mode power supply to the radio frequency power amplifier.

An architecture is described for providing a modulator supply, which in one example is a composite/hybrid supply comprising a switch mode and/or lower frequency part and a linear and/or higher frequency part to a radio frequency (RF) power amplifier (PA). The integrated circuit comprises a low-frequency power supply path comprising a switching regulator and a high-frequency power supply path, whereby in combination the low-frequency power supply path and high-frequency power supply path provide a power supply to an output port of the integrated circuit for coupling to a load, such as in one example a supply port of the RF PA. The architecture, which in some examples may comprise one or more integrated circuits and/or components, further comprises an amplifier core arranged to drive a power supply signal on the high-frequency power supply path wherein the amplifier core comprises an input comprising a voltage feedback from the output port. In some examples, a switch mode power supply (SMPS) acts as a controlled current source where the voltage feedback provides control of the SMPS voltage. Also this voltage feedback loop ensures that the voltage at the load (e.g. supply port of the RF PA), which is a composite of the instantaneous currents from the switched mode power supply and the amplifier interacting with the impedance of the load (e.g. supply port of the PA), tracks the target reference voltage. The amplifier output is AC coupled to the power supply path. Hence, in this manner and in some example embodiments, an integrated circuit for providing an improved linear and efficient supply voltage for a power amplifier, and in particular a wideband power supply voltage for a power amplifier, is described.

Figure 4:
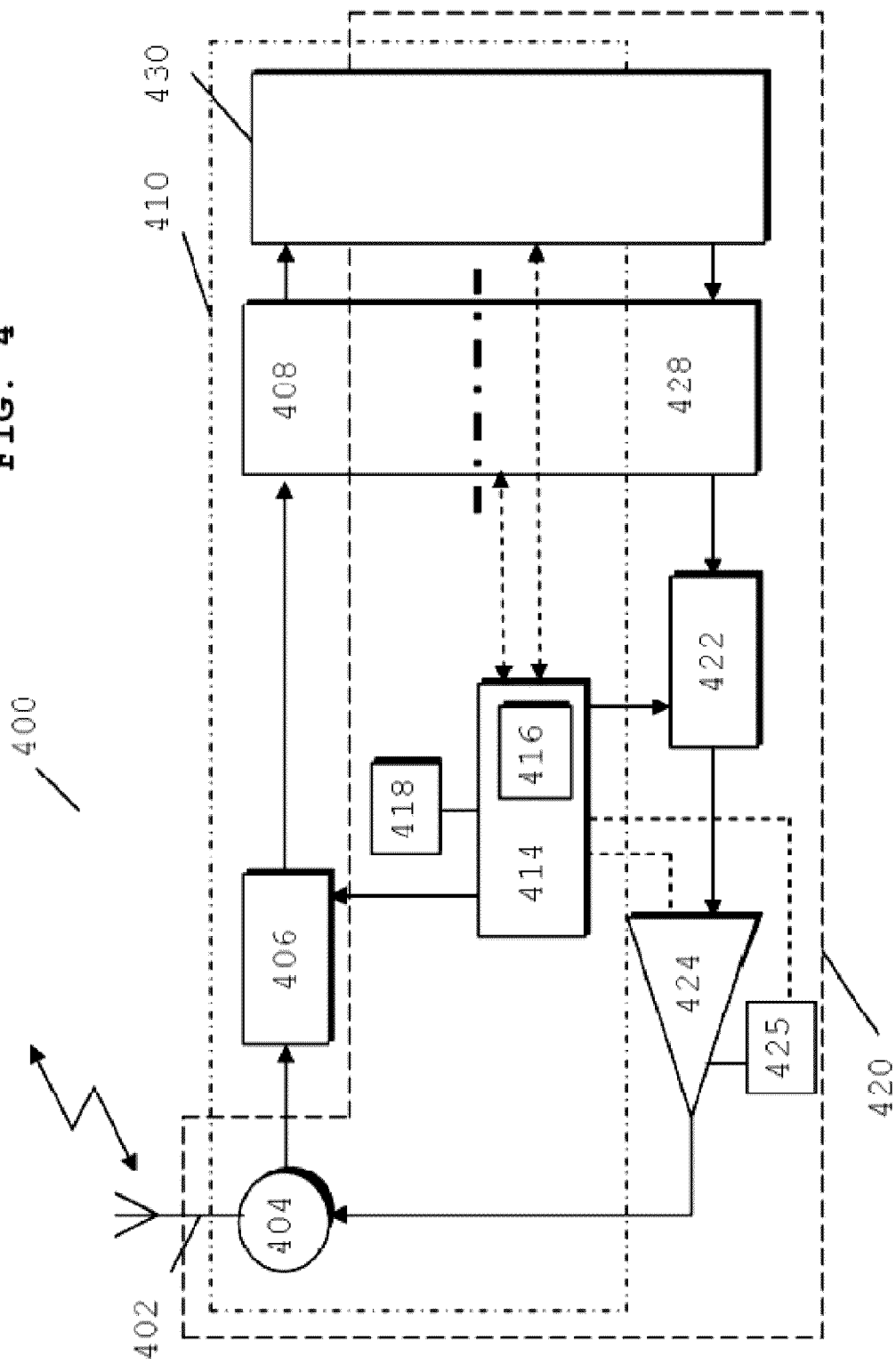
FIG. 4 illustrates an example block diagram of a wireless communication unit adapted to support envelope tracking.

Referring first to FIG. 4, a block diagram of a wireless communication unit (sometimes referred to as a mobile subscriber unit (MS) in the context of cellular communications or an user equipment (UE) in terms of a $3^{rd}$ generation partnership project (3GPP™) communication system) is shown, in accordance with one example embodiment of the invention. The wireless communication unit 400 contains an antenna 402 preferably coupled to a duplex filter or antenna switch 404 that provides isolation between receive and transmit chains within the wireless communication unit 400.

The receiver chain 410, as known in the art, includes receiver front-end circuitry 406 (effectively providing reception, filtering and intermediate or base-band frequency conversion). The front-end circuitry 406 is coupled to a signal processing function 408. An output from the signal processing function 408 is provided to a suitable user interface 430, which may encompass a screen or flat panel display. A controller 414 maintains overall subscriber unit control and is coupled to the receiver front-end circuitry 406 and the signal processing function 408 (generally realised by a digital signal processor (DSP)). The controller is also coupled to a memory device 416 that selectively stores various operating regimes, such as decoding/encoding functions, synchronisation patterns, code sequences, and the like.

In accordance with examples of the invention, the memory device 416 stores modulation data, and power supply data for use in supply voltage control to track the envelope of the radio frequency waveform output by the wireless communication unit 400 and processed by signal processing function 408. Furthermore, a timer 418 is operably coupled to the controller 414 to control the timing of operations (transmission or reception of time-dependent signals and in a transmit sense the time domain variation of the PA (drain) supply voltage within the wireless communication unit 400).

As regards the transmit chain, this essentially includes the user interface 430, which may encompass a keypad or touch screen, coupled in series via signal processing function 428 to transmitter/modulation circuitry 422. The transmitter/modulation circuitry 422 processes input signals for transmission and modulates and up-converts these signals to a radio frequency (RF) signal for amplifying in the power amplifier module or integrated circuit 424. RF signals amplified by the PA module or PA integrated circuit 424 are passed to the antenna 402. The transmitter/modulation circuitry 422, power amplifier 424 and PA supply voltage module 425 are each operationally responsive to the controller 414, with the PA supply voltage module 425 additionally responding to a reproduction of the envelope modulated waveform from the transmitter/modulation circuitry 422.

The signal processor function 428 in the transmit chain may be implemented as distinct from the processor 408 in the receive chain 410. Alternatively, a single processor may be used to implement processing of both transmit and receive signals, as shown in FIG. 4. Clearly, the various components within the wireless communication unit 400 can be realised in discrete or integrated component form, with an ultimate structure therefore being merely an application-specific or design selection.

Furthermore, in accordance with examples of the invention, the transmitter/modulation circuitry 422, together with power amplifier 424, PA supply voltage 425, memory device 416, timer function 418 and controller 414 have been adapted to generate a power supply to be applied to the PA 424. For example, a power supply is generated that is suitable for a wideband linear power amplifier, and configured to track the envelope waveform applied to the PA 424.

Figure 5:
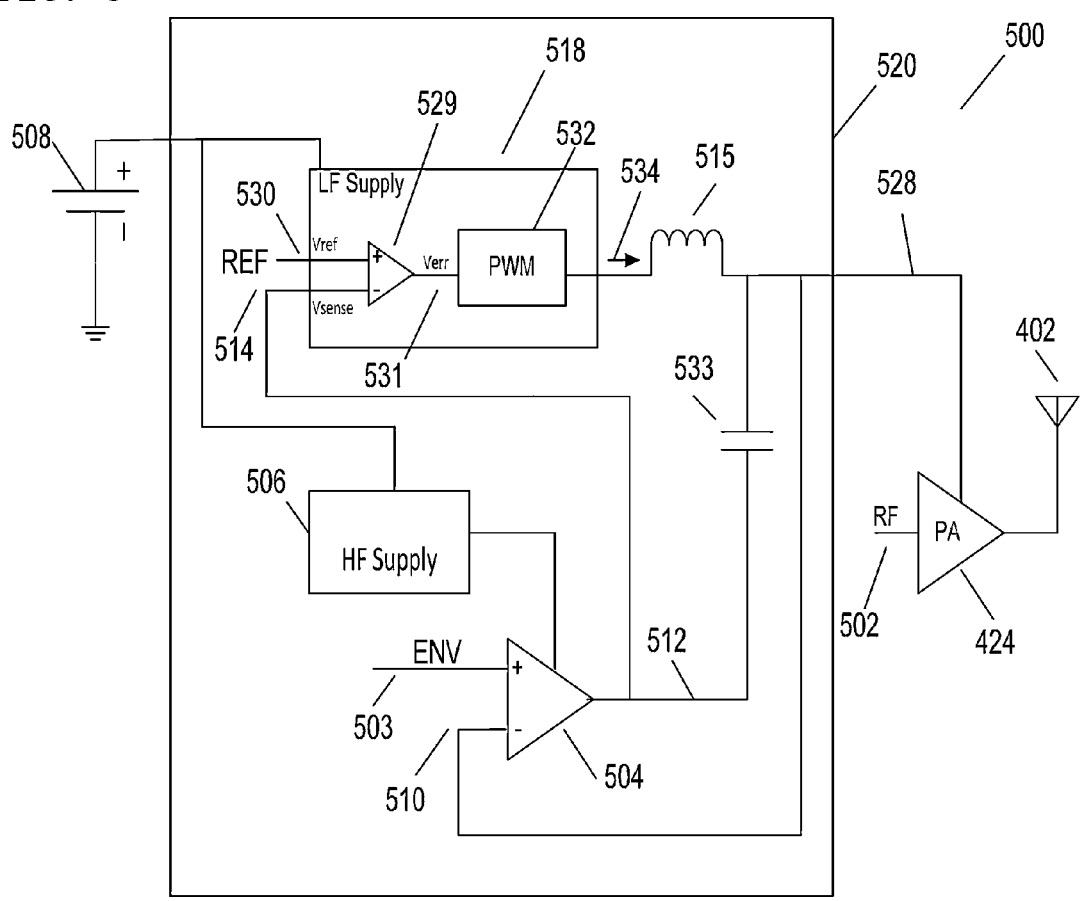
FIG. 5 illustrates one example block diagram of a part of a power supply circuit of a transmitter chain of a wireless communication unit adapted to support envelope tracking.

Referring now to FIG. 5, one generic example block diagram of a part of a power supply circuit 500 of a transmitter chain of a wireless communication unit is illustrated, for example the wireless communication unit of FIG. 4. The power supply circuit 500 in FIG. 5 has been configured and/or adapted to support envelope tracking. A power amplifier (PA) 424 receives an envelope modulated RF signal 502 as an input RF signal to be amplified. The PA 424 amplifies the RF signal and outputs an amplified envelope modulated RF signal to an antenna 402. The PA 424 receives a power supply from a power supply integrated circuit 520, as illustrated. A power source, such as battery 508, is operably coupled to a low-frequency-path supply module 518 in the power supply integrated circuit 520, which in one example is arranged to supply a low-frequency current 534, as part of a power supply to the PA 424, in a highly efficient manner.

The battery 508 is also operably coupled to a high-frequency-path supply module 506, which in one example is arranged to provide a voltage supply, such as a switch mode power supply, to a linear amplifier 504 in a highly efficient manner. In an alternative example, the high-frequency-path supply module 506 may be by-passed, such that the linear amplifier 504 is supplied directly from the power source, e.g. battery 508. The linear amplifier 504 receives, as a first input, an envelope signal 503 that is arranged to track the envelope of the RF signal 502 that is input to the PA 424. The linear amplifier 504 comprises a second input that receives voltage feedback 510 of the voltage 528 applied to the PA 424, which is used to control the voltage at the load (e.g. power supply port of the PA 424).

The low-frequency-path supply module 518 receives, as an input, a voltage feedback signal 514 coupled from the output 512 of the linear amplifier 504. The output 512 from the linear amplifier 504 is also coupled to the voltage at the power supply port of the PA 424 through a capacitor 533. The linear amplifier 504, which in one example is of a class-AB configuration, provides power supply signal energy to an output of the power supply IC 520 that is not supplied by the low-frequency supply module 518.

In one example circuit, within the low-frequency-path supply module 518 there exists an error amplifier 529. The error amplifier 529 compares the voltage feedback signal 514 to a reference voltage 530, and produces an error voltage 531. In some examples, the error amplifier 529 also includes frequency compensation to ensure stability of the feedback loop. In one possible example, the frequency compensation may have an integrating characteristic, such that the time-averaged difference between the reference voltage 530 and the sense voltage 514 is driven to zero. The unity-gain bandwidth of the integrator may be constrained to be lower in frequency than other dynamic elements of the feedback loop, so as to ensure stability. In alternative examples, it is envisaged that other frequency compensation techniques used in switching regulators may also be used. In this manner, the error voltage 531 acts as an input to a pulsewidth modulator 532, which provides a low-frequency current 534 to the inductor 515. This arrangement is commonly used in switching regulators. In one example, the pulsewidth modulator 532 operates by comparing the error voltage 531 to a periodic triangular waveform of fixed ramp rate. The output of this comparison is a pulsewidth-modulated signal that can be used to generate the low-frequency current 534.

In a steady state condition, the low-frequency current 534 that is applied to the power supply port of the PA 424 may be arranged to be sufficient to provide the DC current, whilst the linear amplifier 504 sources the AC current. In this manner, the use of a voltage sense arrangement, as described, facilitates monitoring the output voltage 512 of the linear amplifier 504. The low-frequency-path supply module acts to maintain the output voltage 512 of the linear amplifier at such a level that the amplifier operates within its designed output voltage range. It does so by varying the level of output current 534 provided. Current sensing may be used in some examples to improve the response of the switching regulator. Hence, the linear amplifier 504 is supplied from a second switch mode power supply (SMPS), namely the high-frequency-path supply module 506, with the output of the linear amplifier 504 AC coupled (via the high-frequency path coupling element 533) to the output feeding the load (namely the power supply port of the PA 424).

Advantageously, AC coupling of the high-frequency power supply signal to the output port of the IC 520 using the coupling capacitor 533 allows the quiescent voltage operating point at the output of the linear amplifier 504 to be decoupled from the supply requirements of the power amplifier 424, thereby taking advantage of the differences in the voltage compliance requirements of the linear amplifier 504 and the power amplifier 424.

In order to better appreciate the operation of FIG. 5, let us consider that the ac-coupling capacitor 533 stores a fixed charge, resulting in a fixed voltage Vcap and that the low-frequency path is inactive. If the linear amplifier 504 has an output voltage Vamp, then the supply voltage to the PA will be Vamp+Vcap. If the output voltage of the linear amplifier 504 has an average value Vampdc and a time-varying value Vampac, then the supply voltage to the PA 424 will be:

Vampdc+Vampac+Vcap.

Thus the average value of the supply voltage to the PA 424 will be Vcap+Vampdc, its maximum value will be Vcap+Vampdc plus the maximum value of Vampac, and its minimum value will be Vcap+Vampdc plus the minimum value of Vampac.

By selecting an appropriate value for the level shifting voltage Vcap, it is possible to reduce the supply voltage to the linear amplifier 504 such that it is just sufficient to supply a full range of an ac voltage swing on the PA supply, as well as allow the capacitor 533 add enough voltage to provide the correct average voltage on the PA supply. Minimizing the supply voltage to the linear amplifier in this way also minimizes power dissipation in the supply modulator 520. For this scheme to function properly in a real circuit, the LF supply 518 should be configured to maintain the proper voltage across the ac coupling capacitor. Further examples are illustrated in later figures detailing how this can be achieved.

The example in FIG. 5 uses a control loop, sensing the voltage at the output voltage of the linear amplifier 504, to control the current of the main SMPS. In this example arrangement, the voltage across the AC coupling capacitor is determined by the voltage sense at the output of the linear amplifier 504, which is then compared with a target voltage, together with a voltage sensed at the PA load, which is fed back to the (differential) linear amplifier 504 where it is compared with the envelope reference signal 503.

When a SMPS is used to supply the linear amplifier 504, this reduced voltage supply requirement for the linear amplifier 504 requires a lower current draw from the main energy source e.g. battery 508, as compared to a case when it is directly coupled to the PA load, thereby resulting in an overall efficiency improvement. In some examples, and advantageously, the target amplifier output voltage can be adjusted for different output power levels and transmission modulation schemes, in order to optimise the amplifier supply requirements.

The generic example block diagram of FIG. 5 comprises at least the following common circuit elements or components that are replicated in the example embodiments of FIGS. 6-10: a low-frequency power path implemented for example with a switching regulator; a high-frequency power supply path driven by an amplifier, such as a linear amplifier 504 exhibits, say, a Class AB mode of operation; voltage feedback 514 from the output of the linear amplifier 504 to the switching regulator of the low-frequency power supply path 518; a voltage feedback 510 from the PA supply voltage 528 to the linear (e.g. Class AB) amplifier 504; and a capacitor 533 (and in some examples inductor 515) that couples the high-frequency and low-frequency power supply paths together. By using the capacitor 533 (and in some examples inductor 515), it is possible to combine power at dc and low frequencies from the switching regulator 518 with higher-frequency ac power from the linear amplifier 504.

Thus, FIG. 5 illustrates a means for implementing a wideband power supply in a power efficient manner. The power supply is configured to provide power to a load, such as a power supply for a RF Power Amplifier (PA), and in particular an envelope tracking supply that may achieve high efficiency when driving PAs of differing load characteristics. The power supply may also, and advantageously, be configured to provide supply envelopes corresponding to different modulation formats.

Figure 6:
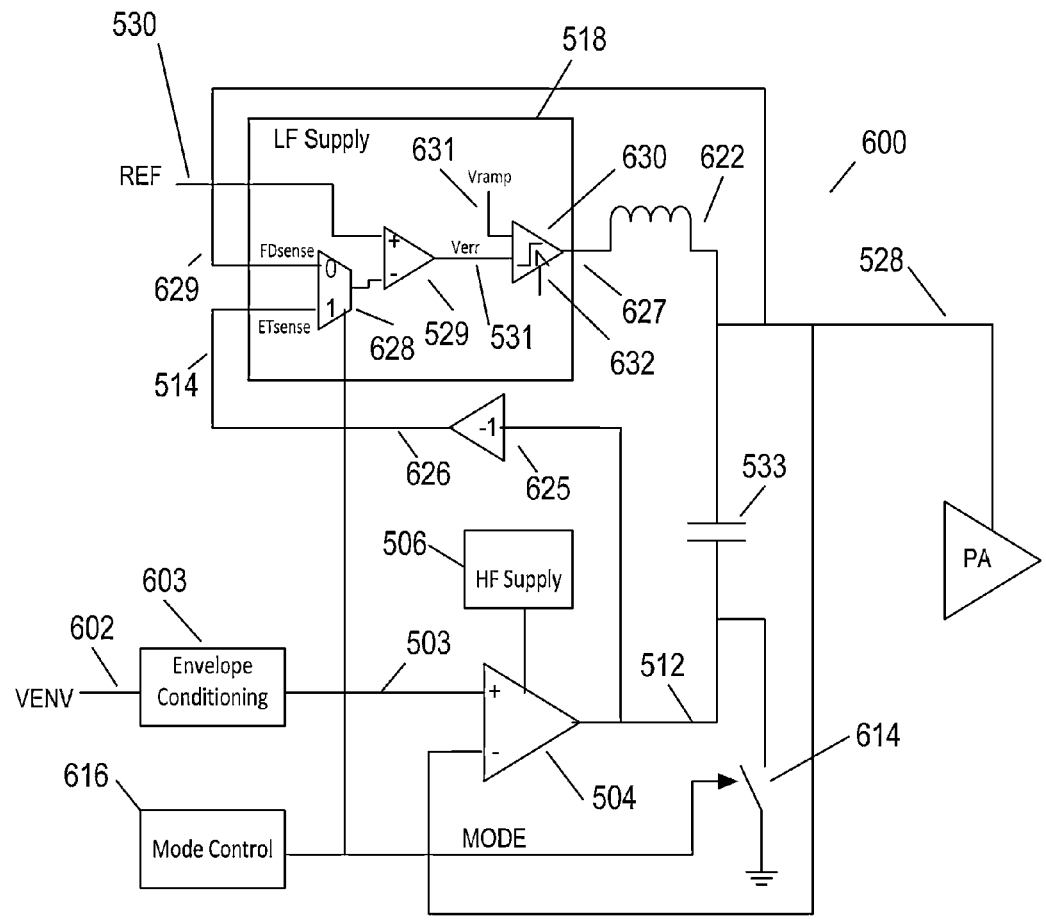
FIG. 6 illustrates a further example block diagram of a part of a power supply circuit of a transmitter chain of a wireless communication unit adapted to support envelope tracking.

Referring now to FIG. 6, a more detailed example block diagram of a part of a power supply circuit 600 of a transmitter chain of a wireless communication unit, adapted to support envelope tracking, is illustrated. The operation of elements described with reference to FIG. 5, with like reference numerals used, is not replicated in describing FIG. 6 in order to ease understanding. The battery and high-frequency-path supply are used in the same way in FIG. 6 as in FIG. 5, but their symbols have been removed from FIG. 6 for clarity. In FIG. 6, an envelope voltage 602 is input to an envelope conditioning module 603. The envelope conditioning module 603 is arranged to modify and limit the envelope signal characteristics, which in some examples may involve one or more of a number of actions, for example:
  (i) limiting a minimum value of the power supply to meet requirements of the PA
  (ii) reducing the peak-to-peak voltage of the envelope signal improving efficiency,
  (iii) restricting the signal bandwidth of the envelope signal,
  (iv) performing any necessary gain and offset alignment of the envelope signal; and
  (v) implementing any signal formatting, such as converting between differential and single ended representation.

The inventors have identified that an envelope tracking supply has limited benefits when lower output levels are used, or certain modulation schemes are used with reduced AC content leading to lower PAR envelope waveforms. For such low output levels and/or modulation schemes, the DC voltage applied to the PA has a greater significance with the power of the AC content of the envelope significantly reduced, negating the benefits of envelope tracking and the efficiency performance gain is reduced. Therefore, in these scenarios, a fixed drain (FD) mode of operation is able to take full advantage of the full switching supply. Although the application of the DC components and AC components is described with reference to FIG. 6, it is envisaged that such application is common to a number of the other described example embodiments.

Thus, in some examples of the invention, two modes of operation are supported, namely an envelope tracking (ET) mode and a fixed drain (FD) mode. The selection of the mode to be used in providing the power supply to the PA is performed by mode control module 616.

ET Mode:

In ET mode, the PA power supply is a time varying signal, which tracks the required signal envelope, in order to achieve the efficiency benefits discussed.

There are at least two operational factors that favour use of ET mode, namely high crest factor signals (i.e. where the peak-to-average ratio of the envelope signal is high) and higher output power levels, whereas the minimum voltage requirement of the PA and the power overhead of the AC path (including the quiescent power of the amplifier) is less important. Hence, in one example, the benefit of the mode control module 616 setting the power supply to an ET mode of operation is greatest for signals using modulation schemes that result in high crest factor power envelope signals, for the upper section of the output power range.

In both the ET mode and the FD mode, the power supply system has to provide the full power spectrum, i.e. both high-frequency and low-frequency energy. Both the ET mode and the FD mode use a switch mode power supply (SMPS) arrangement in order to supply the low-frequency power. However, the two modes of operation differ in how they handle the high-frequency requirements.

In ET mode, the switch 614 is configured as 'open', the linear amplifier 504 and high-frequency-path supply module 506 are enabled, and the (ET-) sense feedback input 514 if the low-frequency-path supply module 518 is selected. The linear amplifier 504 operates in voltage feedback to force the output voltage 528 to be substantially equal to the conditioned envelope voltage 503. The ET-sense feedback voltage 514 may then be compared to a reference voltage, which in one example is generated using a digital-to-analog converter (DAC) (not shown).

Thus, in this manner in the ET mode, the AC coupling capacitor 533 performs a function of a dc level shifter and the high-frequency power is provided by the linear amplifier 504. Using this active path for the high-frequency power allows the output power supply to track the RF envelope (see FIG. 1 image 120), which limits the power dissipated in the PA 424. However, in ET mode, the power dissipation in the power supply module may be larger because the high-frequency-path power supply 506 and the linear amplifier 504 must be powered on.

In ET mode, the circuit of FIG. 6 may be operated such that there is always a positive charge, for example the voltage at the output 528 is greater than voltage at the output of the amplifier 512, stored on the capacitor 533. In this manner, it is possible for the output voltage 528 to exceed the output range of the linear amplifier 504. The power supply produced by the high-frequency-path power supply 506 need be only of sufficient voltage to sustain the ac amplitude of the envelope voltage 602. In this way, the power dissipated within the linear amplifier can be minimized.

The voltage feedback loop, which includes the inverting stage 625 and the low-frequency-path power supply 518, ensures that the average output voltage of the linear amplifier 504 and the voltage across the coupling capacitor 533 are maintained at the appropriate levels. The inverting stage 625 produces a complementary signal to the linear amplifier output voltage 512. The feedback voltage 514 is then passed through the analog multiplexer 628, which is used to select between ET and FD modes. The output of the analog multiplexer 628 is then compared to a reference voltage 530 in error amplifier 529, and the resulting error voltage Verr 531 is generated.

As in FD mode, the error amplifier 529 contains compensation to stabilize the loop. The compensation has a low-pass characteristic, which helps to filter out high-frequency information present in the feedback voltage 514. Also as in FD mode, the pulsewidth modulator formed by the comparator 630 and ramp voltage 631 produces a pulsewidth modulated power output 627. This power output is filtered by inductor 622 to provide a roughly constant current to the output 528. In some examples, the inductor 622 and capacitor 533 form a low-pass filter, which is configured to locate a double pole in a low energy range of a power spectral density of the reference signal 530. In this manner, the feedback loop acts in such a way as to maintain the average amplifier output voltage 512 equal to the reference voltage REF 530.

FD Mode:

In FD mode, switch 614 is configured as 'closed', the linear amplifier 504 and high-frequency-path supply module 506 are disabled, and the (FD-) sense feedback input 629 of the low-frequency-path power supply is selected. In FD mode, the output 512 from the linear amplifier 504 is coupled to a fixed drain (FD) mode switch 614, which in a closed configuration (as set, for example by mode control module 616) grounds the output from the linear amplifier 504. In this FD mode, the PA power supply is fixed at the minimum voltage requirement (of the PA 424) in order to support the transmitted envelope waveform, for example for a time period between power level updates.

In the FD mode, the power supply may be re-configured to use the AC coupling capacitor 533 as a filtering element for the DC-DC SMPS. In this manner, the AC coupling capacitor 533 provides the high-frequency power required by the PA. In FD mode, the linear amplifier and high-frequency-path regulator may be disabled to save power. The PA supply voltage 528 is at a higher level in FD mode (see FIG. 1 image 110), but the quiescent current of the power supply is lower.

In some examples, the operation of the circuit in FD mode resembles a conventional voltage-mode buck regulator. The FD-sense feedback voltage 629 passes through an analog multiplexer. The FD-sense feedback voltage 629 is then compared to a reference voltage REF 530, which in one example is generated using a digital-to-analog converter (DAC) (not shown). The difference between the FD-sense feedback voltage 629 and voltage REF 530 is amplified by the differential error amplifier 529, which includes frequency compensation for loop stability. The resulting error voltage Verr 531 is compared to a ramp voltage 631 by comparator 630.

In some examples, the comparator 630 may be reset at, say, a fixed periodic rate by a clock signal, thereby producing a rising edge at a fixed rate, whilst the falling edge is determined, for example, by the output of the comparator 630, thereby producing a pulse wave modulated (PWM) power output 627. In some examples, the PWM power output may then be filtered by, say, inductor 622 and coupling capacitor 533 in order to remove high frequency components and produce the output power supply 528. The feedback loop acts to maintain the voltage at the output 528 that may be equal to the input reference signal REF 530. This configuration is commonly used in switched-mode power supplies and is known as 'voltage-mode' control.

As an alternative to PWM modulation, any of a number of well-known modulation schemes that convert a control voltage to a duty cycle may be used.

Figure 7:
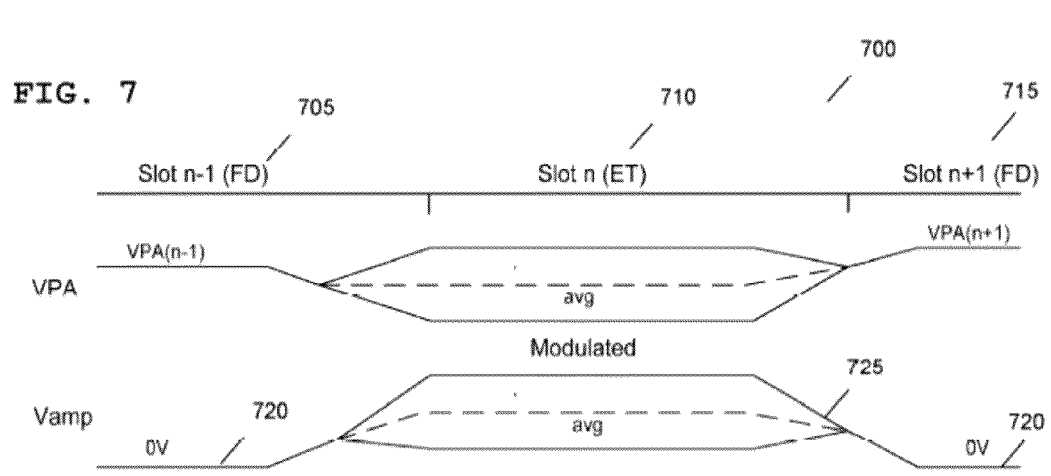
FIG. 7 illustrates an example timing diagram of a power supply circuit of a transmitter chain of a wireless communication unit adapted to support both envelope tracking and fixed drain.

Transition Between ET Mode and FD Mode:

A particular feature of the more detailed example block diagram of a part of a power supply circuit 600 of FIG. 6 is that it supports a transition from FD mode in a first (e.g. n−1) time slot 705 to ET mode in a second (e.g. n) time slot 710 and thereafter from ET mode in the second (e.g. n) time slot 710 to FD mode in a third (e.g. n+1) time slot 715, as illustrated in the example timing diagram 700 of FIG. 7. The architecture shown in FIG. 6 ensures a speedy transition with a minimum of disruption to the power supply output 528. The same error voltage Verr 531 is used in both FD mode and in ET mode, which ensures that no abrupt changes in duty cycle are observed during a mode transition. When transitioning from FD mode in a first (e.g. n−1) time slot 705 to ET mode in a second (e.g. n) time slot 710, it is desirable that the amplifier output 512 of linear amplifier 504 makes a gradual transition from ground to its final modulated voltage. In order to ensure this, during the transition from FD mode in a first (e.g. n−1) time slot 705 to ET mode in a second (e.g. n) time slot 710, the dc and ac values of the conditioned envelope voltage 503 are gradually ramped up from zero volts 720 to their final values 725. Conversely, when making a transition from ET mode in the second (e.g. n) time slot 710 to FD mode in a third (e.g. n+1) time slot 715, the dc and ac values of the conditioned envelope voltage 503 are gradually decreased from their steady-state values 725 to zero volts 720. Through use of such ramped and tapered envelope signals, abrupt disturbances to the control loop can be eliminated, thereby keeping the power supply within regulation throughout the transition, as illustrated in FIG. 7.

Figure 8:
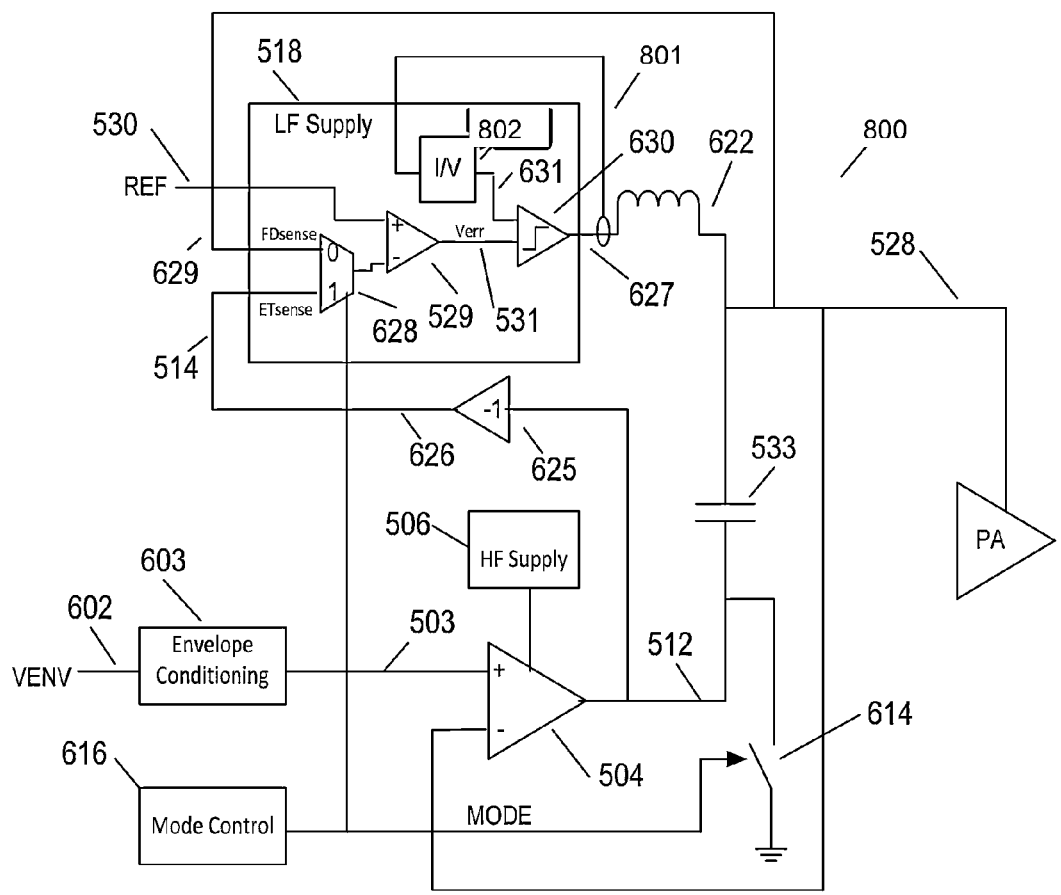
FIG. 8 illustrates a yet further example block diagram of a part of a power supply circuit of a transmitter chain of a wireless communication unit adapted to support envelope tracking.

FIG. 8 illustrates a yet further example block diagram 800 of a part of a power supply circuit of a transmitter chain of a wireless communication unit adapted to support envelope tracking. The yet further example of FIG. 8 highlights an alternative way of controlling the low-frequency-path supply 518. For ease of understanding, and not to obfuscate or distract from the description of FIG. 8, electronic components and circuits of the transmitter chain described with reference to earlier figures will not be explained again in any greater extent than that considered necessary.

It is contemplated that any of a number of control methods may be used in the low-frequency-path power supply 518, both in FD mode and in ET mode in various example embodiments of the invention. For example, the well-known voltage-mode control approach may be used, as shown in FIG. 6. In the example of FIG. 8, a current-mode feedback control loop including elements 801, 802 and 630 is used. Current-mode control is a well-known method used in switching regulators, in which the current through the inductor is sensed and feedback control applied to stabilize it. A voltage feedback loop is also used to regulate the output voltage, just as in a voltage-mode controller. The ET voltage feedback loop consists of elements 512, 625, 514, 628, 529, 531, 630, 622. The FD voltage feedback loop includes elements 629, 628, 529, 531, 630, 622. The advantages of adding the current loop include simpler compensation methods required for the voltage loop as well as a faster response to certain types of transient disturbances.

In the example of FIG. 8, a conventional current-mode switched mode power supply is used as the low-frequency-path supply. A current sensor 801 monitors the instantaneous current in the inductor 622. The current is converted to a voltage by the current-to-voltage converter 802. The resulting voltage is used as the ramp voltage 631, which is compared to the error voltage 531 by the comparator 630. This feedback loop operates in both FD and ET modes, just as in the circuit of FIG. 6.

Figure 9:
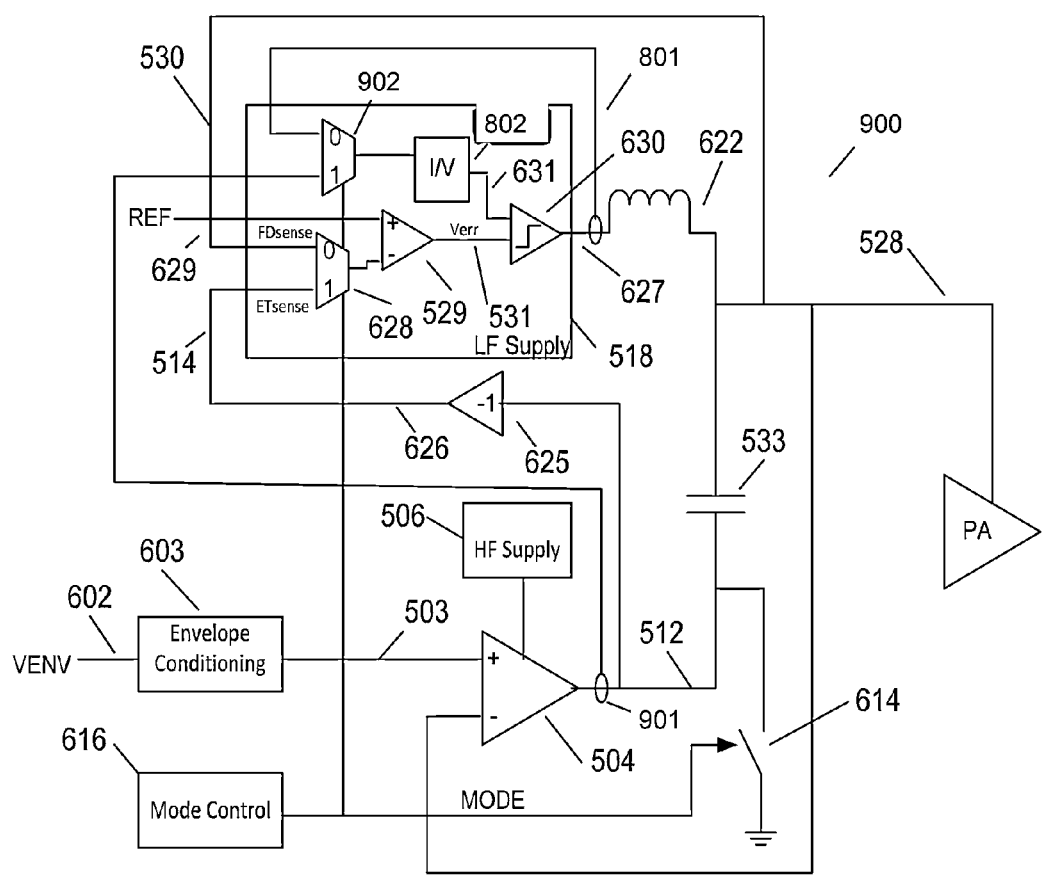
FIG. 9 illustrates a still further example block diagram of a part of a power supply circuit of a transmitter chain of a wireless communication unit adapted to support envelope tracking.

FIG. 9 illustrates a still further example block diagram 900 of a part of a power supply circuit of a transmitter chain of a wireless communication unit adapted to support envelope tracking. The yet further example of FIG. 9 highlights an alternate method of realizing current-mode feedback. For ease of understanding, and not to obfuscate or distract from the description of FIG. 9, electronic components and circuits of the transmitter chain described with reference to earlier figures will not be explained in any greater extent than that considered necessary.

In the circuit of FIG. 9, the low-frequency-path power supply 518 has two current-sense feedback inputs. In addition to the inductor current sensor 801 there is a current sensor 901 at the output of the linear amplifier 504. A second analog multiplexer 902 is arranged to select between the two current-sense feedback inputs and passes the selected input through to the current-to-voltage converter 802. The current-sense 801 from the low-frequency-path supply is used in FD mode, as in FIG. 8. In ET mode, the amplifier current sensor 901 is used. The output current of the linear amplifier 504 contains high-frequency information about the instantaneous current drawn by the PA 424, because the amplifier supplies this high-frequency current. Using this configuration, information about the current demands of the PA 424 can be fed back through the current loop of the SMPS, which has much higher bandwidth than the voltage loop. This implies that, using the circuit of FIG. 9, the low-frequency-path voltage regulator can potentially respond faster to the demands of the PA.

Figure 10:
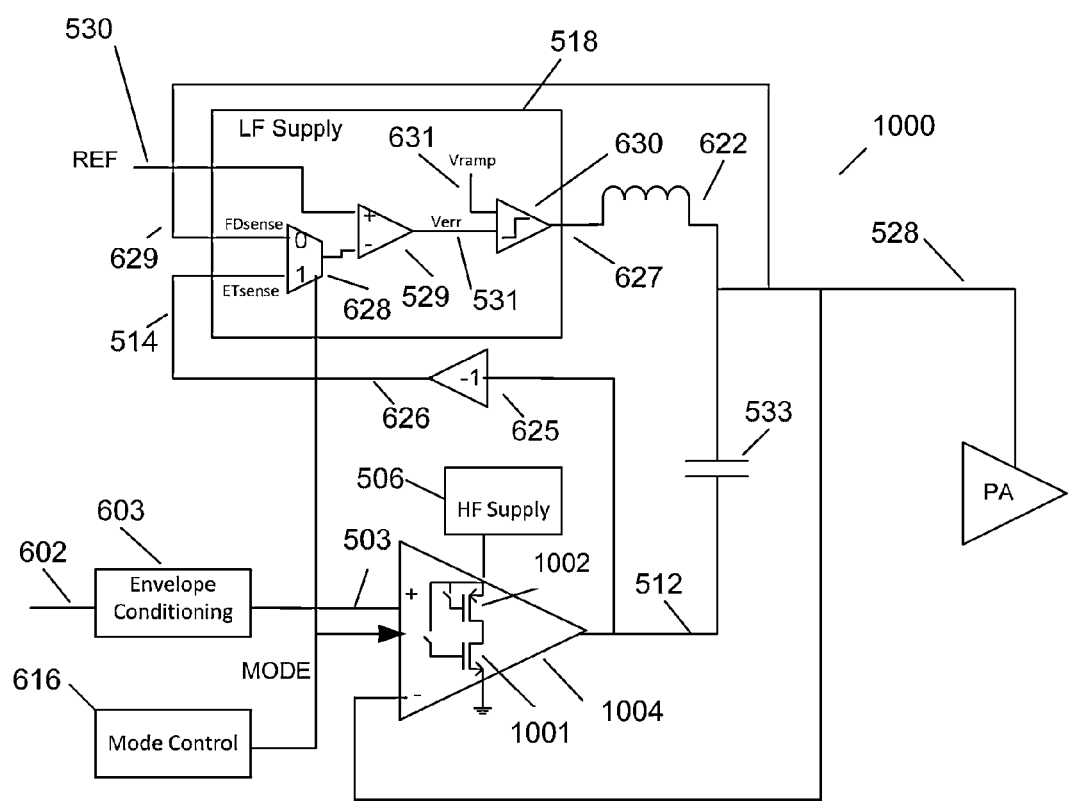
FIG. 10 illustrates a yet still further example block diagram of a part of a power supply circuit of a transmitter chain of a wireless communication unit adapted to support envelope tracking.

FIG. 10 illustrates a yet still further example block diagram 1000 of a part of a power supply circuit for a PA of a transmitter chain of a wireless communication unit adapted to support envelope tracking. For ease of understanding, and not to obfuscate or distract from the description of FIG. 10, electronic components and circuits of the transmitter chain described with reference to earlier figures will not be explained in any greater extent than that considered necessary.

The output 503 from the envelope conditioning module 603 is input to the linear amplifier 1004. In FIG. 10, the devices that comprise the output stage of the linear amplifier 1004 are shown explicitly as n-channel transistor 1001 and p-channel transistor 1002. This example of FIG. 10 does not include a discrete switch to ground the bottom plate of the coupling capacitor 627 in FD mode. Instead, the output devices (namely n-channel transistor 1001 and p-channel transistor 1002) of the linear amplifier 1004 can be configured in two ways. In ET mode, these two transistors/devices operate as part of the linear amplifier 1004. In FD mode, the n-channel transistor 1001 is switched on and the p-channel transistor 1002 is switched off. In this way, the output of the linear amplifier 1004 is strongly coupled to ground, thereby emulating the switch of earlier examples. Although this example is described in terms of switching to ground via n-channel transistor 1001 (e.g. an nMOS switch), a more general case may be to switch to a DC voltage, which could be a supply voltage, in which case the p-channel transistor 1002 could be used. By encompassing the amplification and ground switching functions in a single element, the complexity of the circuit can be advantageously reduced.

In one alternative implementation, the NMOS device(s) of the linear amplifier 1004 may be used together with a supplementary switch (not shown), in order to use and benefit from a combination of both methods and architecture of FIG. 8 and FIG. 10.

Figure 11:
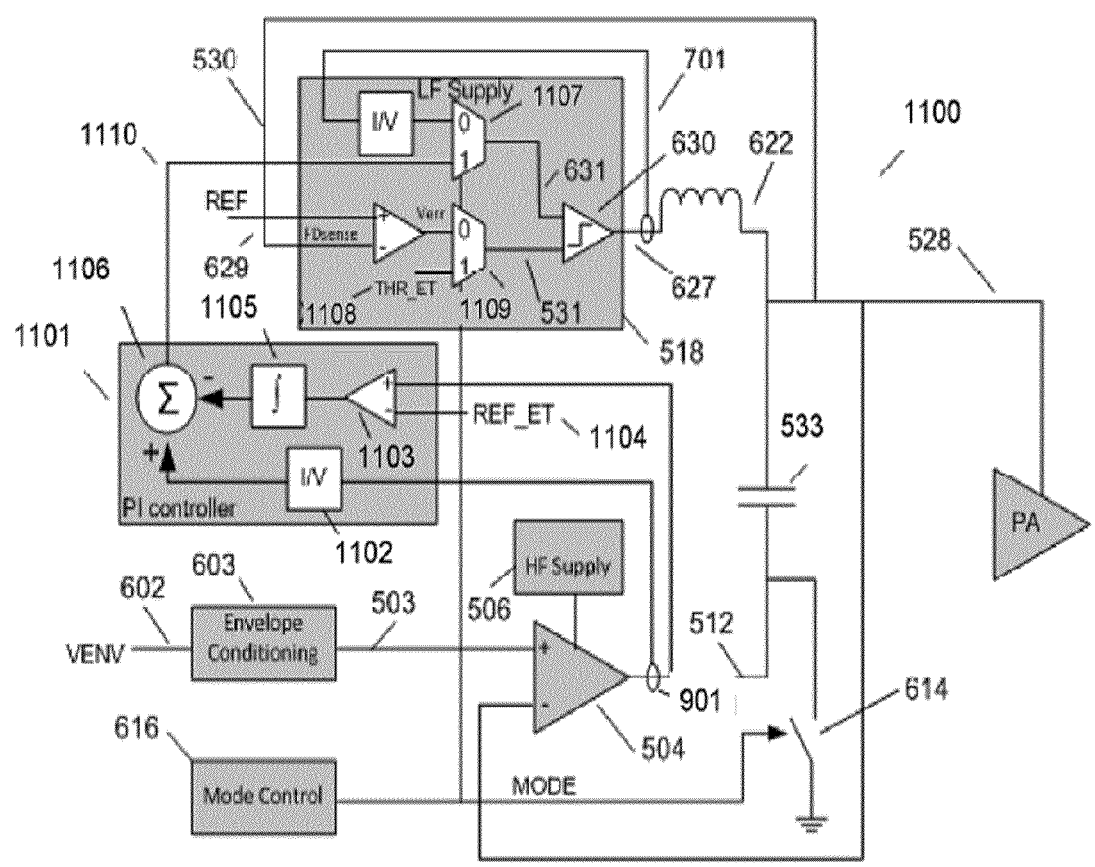
FIG. 11 illustrates a yet still even further example block diagram of a part of a power supply circuit of a transmitter chain of a wireless communication unit adapted to support envelope tracking.

FIG. 11 illustrates a yet still even further example block diagram 1100 of a part of a power supply circuit for a PA of a transmitter chain of a wireless communication unit, adapted to support envelope tracking. The example of FIG. 11 illustrates an alternate way to implement the control loop for ET mode in which the FD control loop and ET control loop are largely independent of each other. In some examples, this may be advantageous if different characteristics are desired for the two control loops. For ease of understanding, and not to obfuscate or distract from the description of FIG. 11, electronic components and circuits of the transmitter chain described with reference to earlier figures will not be explained in any greater extent than that considered necessary.

The ET mode control loop of the circuit of FIG. 11 contains a proportional integral (PI) controller 1101 that is independent from the low-frequency-path regulator. Within the PI controller 1101 there is a current-voltage (I/V) converter 1102 that converts the current information from current sensor 901 into a voltage. There is also a difference amplifier 1103 that amplifies the difference between the output voltage 512 of the linear amplifier 504 and a reference voltage REF_ET 1104. The reference voltage REF_ET 1104 represents the desired average output voltage 512 of the linear amplifier 504. The output of the difference amplifier 1103 is integrated by the integrator 1105. The difference between the output voltage of the integrator 1105 and that of the I/V converter 1102 is then computed by the summation circuit 1106.

The output voltage 1110 of the summation circuit 1106 represents the instantaneous current at the output of the linear amplifier 504, plus a slowly-varying term that reflects the integrated difference between the output voltage 512 of the linear amplifier 504 and its desired value 1104. As such, the output voltage 1110 can be used directly as the control voltage to a pulsewidth modulator in order to produce the appropriate current to apply to the coupling network. The analog multiplexer 1107 passes this voltage 1110 through to the comparator 630, which compares it to a fixed voltage THR_ET, passed through analog multiplexer 1109.

Thus, it can be seen that the comparator 630 compares a difference between the two inputs 531, 631 in order to stablize the loop. In essence:

Input signal 631−Input signal 531=Viab−Avg (Vabout−REF_ET)−THR_ET

Where: Viab is the current sensing output of I/V convertor 1102; and,

Vabout means class AB output 512 of the linear amplifier 504.

The voltage at THR_ET can be chosen to null out any offsets in the control loop, for example a finite offset resulting from the current ripple through the inductor 622. The resulting PWM waveform is used to control the current through the inductor 622, as in the other example embodiments.

In closed-loop operation, the ET mode control loop tends to force the average output voltage 512 of the linear amplifier 504 to be equal to the desired value 1104. It also tends to force the instantaneous output current of the linear amplifier to zero by supplying more current through the low-frequency path when the output current of the linear amplifier is high.

The FD mode control loop of the circuit of FIG. 11 operates the same as in FIG. 8. The only difference is the location in the circuit of the analog multiplexers 1107 and 1109.

In such ET architectures, the integrity of the peaks of the envelope waveform must be maintained, whereas the integrity of the troughs of the envelope waveform is not critical, provided sufficient voltage headroom is maintained. The troughs of the waveform are associated with a high voltage slew rate. Therefore, in some examples of the invention, the modulated power supply 528 provided to the PA 424 may be referenced to a modified envelope waveform, with the troughs of the envelope waveform clipped or removed, i.e. the depths of the envelope waveform troughs are reduced. Removing the troughs reduces the high-frequency components from the voltage waveform, whilst increasing the DC content of the voltage waveform. This concept will be hereinafter termed 'de-troughing'.

The envelope waveform troughs correspond to the periods of minimum output power from PA 424 and, thus, the clipping or removal (de-troughing) of the troughs of the envelope waveform has minimal (or at least reduced) impact on overall PA power dissipation. In effect, the operating region of the PA 424 results in the PA 424 exhibiting characteristics of a current sink rather than a resistor, with the current being a function of the instantaneous power. The power drawn by the linear amplifier 504 will be $I_{ac}V_{amp}$ where $V_{amp}$ is the amplifier supply voltage.

De-troughing increases the power dissipated by the PA 424, since the current supplied to the PA 424 is essentially the same, but where the voltage at the supply port of the PA is increased. However, since de-troughing is applied at the points of lowest output power, the impact is minimal. De-troughing the reference waveform also reduces the peak-to-peak voltage associated with the high frequency path, thereby reducing the amplifier supply requirements and improving the overall efficiency via the use of a second SMPS.

Thus, and advantageously in an AC coupled architecture as illustrated, de-troughing a waveform has the effect of reducing the peak-to-peak value (AC content), whilst increasing the DC value, and thereby the supply requirement of the linear amplifier 504 is reduced. In effect, additional efficiency in PA power supply may be achieved from the increased efficiency of the low-frequency supply path, as the reduction in voltage supplied from the high-frequency supply amplifier has been effectively, and favourably traded for increased low-frequency energy from the more efficient SMPS.

In one example embodiment, the envelope signal 602 applied to the linear amplifier 504 may be pre-conditioned by de-troughing, in order to reduce the envelope signal headroom with little or minimal impact on the RF performance of the PA 424. In some examples, the pre-conditioning by de-troughing may involve a procedure as simple as limiting a minimum value of the reference waveform to a fixed value, such as the minimum voltage requirement of the PA load. Alternatively, in other examples, the minimum value may be related to the average or rms value of the envelope waveform (e.g. 9 dB below the rms value). In one example embodiment, the de-troughing of the envelope signal 602 applied to the linear amplifier 504 may be additionally pre-conditioned by, say filtering.

In some implementations, the use of PI controller 1101 in FIG. 11 may exhibit a low pass filter response that may introduce an additional delay to the control loop control. The additional delay may be as a result of an extra low frequency pole introduced into the feedback path through use of PI controller 1101, which may also affect the phase margin in the circuit's transient response. In this situation, one example solution is to extract and lock the dc operating point of linear amplifier 504, as illustrated in the example architecture of FIG. 12.

Figure 12:
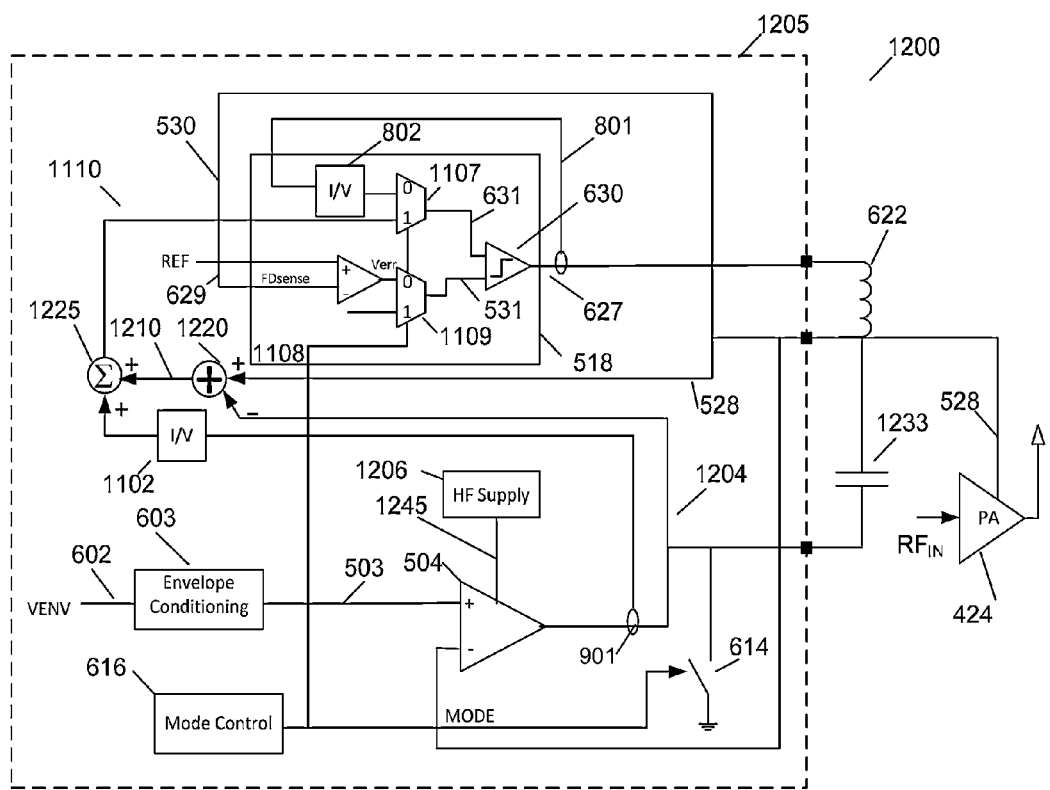
FIG. 12 illustrates a yet still even further example block diagram of a part of a power supply circuit of a transmitter chain of a wireless communication unit adapted to support envelope tracking.

Therefore, FIG. 12 illustrates a yet still even further example block diagram 1200 of a part of a power supply circuit for a PA of a transmitter chain of a wireless communication unit, adapted to support envelope tracking. In this example, an envelope tracking module integrated circuit 1205 is illustrated, with a selected portion of input/output/control pins. A skilled artisan will appreciate that the same IC arrangement with the illustrated components and functions can be applied to the previous architecture drawings.

In ET mode, the second switch mode power supply (SMPS), namely the high-frequency-path supply module 1206 supplies power to linear amplifier 504. The output of the linear amplifier 504 is AC coupled (via the high-frequency path coupling element 1233) to the output feeding the load (namely the power supply port of the PA 424).

In addition, the example of FIG. 12 illustrates a further alternative way to implement the control loop for ET mode in which the FD control loop and ET control loop are largely independent of each other. In some examples, this may be advantageous if different characteristics are desired for the two control loops. For ease of understanding, and not to obfuscate or distract from the description of FIG. 12, electronic components and circuits of the transmitter chain that have been described with reference to earlier figures will not be explained in any greater extent than that considered necessary. In contrast to the ET mode control loop of the circuit of FIG. 11 that contains a proportional integral (PI) controller that is independent from the low-frequency-path regulator, the architecture of FIG. 12 illustrates a use of a subtractor module 1220. The subtractor module 1220 subtracts the output voltage 1204 of the linear class AB amplifier 504, from the modulated power supply 528 provided to the PA 424. In the example embodiment of FIG. 12, the output 1210 from the subtractor module 1220 is added in summing junction 1225 to a voltage representation of the output current of the linear amplifier 504, once the output current has been converted by current to voltage converter 1102.

In the example of FIG. 12, a current-mode switched mode power supply is again used as the low-frequency-path supply, as described with reference to FIG. 11. A current sensor 901 senses the output current of the linear amplifier 504. The output voltage 1110 of the summation circuit 1225 represents the instantaneous current at the output of the linear amplifier 504, plus a slowly-varying term from low passed capacitor 1233 that reflects the integrated difference between the PA supply voltage 528 and the output voltage 1204 of the linear amplifier 504. As such, the output voltage 1110 can be used directly as the control voltage to a pulsewidth modulator in order to produce the appropriate current to apply to the coupling network. The analog multiplexer 1107 passes this voltage 1110 through to the comparator 630, which compares it to a fixed voltage THR_ET, passed through analog multiplexer 1109.

Thus, it can be seen that the comparator 630 compares a difference between the two inputs 531, 631 in order to stablize the loop. However, in contrast to the operation of FIG. 11, and in essence:

Input signal 631–Input signal 531=Viab+Avg (Vout−Vabout)−THR_ET'=Viab−Avg(Vabout−REF_ET)+Avg(Vout−REF_ET)−THRET'=Viab−Avg(Vabout−REF_ET)+REF_CAP−THR_ET'=Viab−Avg(Vabout−REF_ET)+THE_ET Where: Viab is the current sensing output of I/V convertor 1102; and, Vout is the supply output 528 connected to PA 424;

Vabout is the output 1204 of class AB linear amplifier 504; and

REF_CAP=Avg(Vout−REF_ET) is the reference DC voltage for capacitor 1233.

THR_ET'=THR_ET+REF_CAP, while compared to THE_ET 1108 in FIG. 11.

From the above derivative, it can be seen that the circuit of FIG. 12 can operate in the same manner as the circuit in FIG. 11, if THR_ET' is set to THR_ET+REF_CAP. Namely, in closed-loop operation, the ET mode control loop tends to force the voltage of capacitor 1233 to be equal to the desired REF_CAP value in FIG. 12, instead of tending to force the average output voltage 512 of linear amplifier 504 to be equal to the desired REF_ET value in FIG. 11. It also tends to force the instantaneous output current of the linear amplifier to zero by supplying more current through the low-frequency path when the output current of the linear amplifier 504 is high as described in FIG. 11.

In effect, any low pass filtering effect provided by PI controller 1101 in FIG. 11 is inherently achieved by capacitor 1233. A change of the corner frequency of the low pass filter may be achieved via a suitable selection of the capacitance value of capacitor 1233. One advantage of the architecture of FIG. 12 when compared to the architecture of FIG. 11 is that better phase margin may be achieved due to there being no extra low frequency pole generated within the PI controller 1101. Because the AC coupling capacitor 1233 voltage is directly used as a feedback to the current-mode switched mode power supply for the low frequency path, the loop introduces no extra delay. As a consequence, loop compensation can be more easily controlled.

The FD mode control loop of the circuit of FIG. 12 operates the same as described with respect to FIG. 11.

Figure 13:
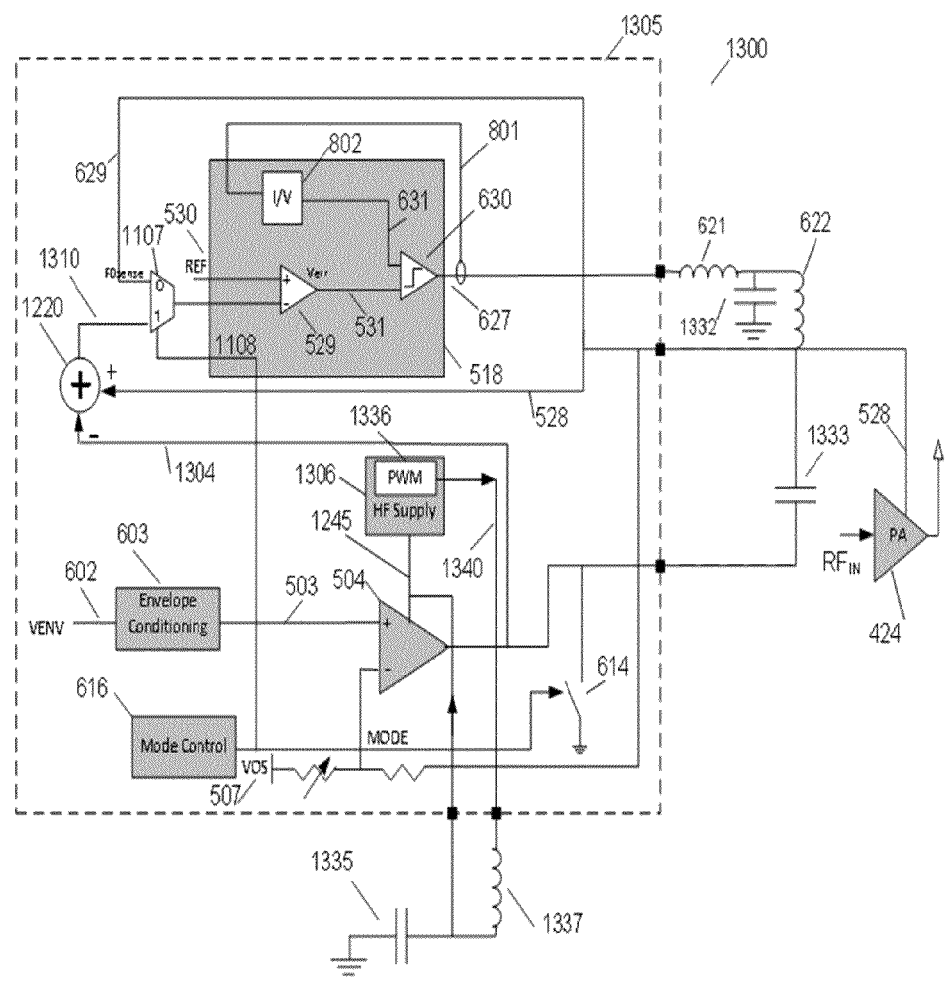
FIG. 13 illustrates a yet still even further example block diagram of a part of a power supply circuit of a transmitter chain of a wireless communication unit adapted to support envelope tracking.

Referring now to FIG. 13, a yet still even further example block diagram 1300 of a part of a power supply circuit for a PA of a transmitter chain of a wireless communication unit, adapted to support envelope tracking, is illustrated. For ease of understanding, and not to obfuscate or distract from the description of FIG. 13, electronic components and circuits of the transmitter chain described with reference to earlier figures will not be explained in any greater extent than that considered necessary. In FIG. 13, one example control arrangement for use in the low-frequency-path power supply 518, both in FD mode and in ET mode is described. In this example, an envelope tracking module integrated circuit 1305 is illustrated, with a selected portion of input/output/control pins. A skilled artisan will appreciate that the same IC arrangement with the illustrated components and functions can be applied to the previous architecture drawings.

In ET mode, the second switch mode power supply (SMPS), namely the high-frequency-path supply module 1306, supplies power to the linear amplifier 504 with the output of the linear amplifier 504 AC coupled (via the high-frequency path coupling element (e.g. capacitor 1333) to the output feeding the load (namely the power supply port of the PA 424). Notably, the example illustrated in FIG. 13 includes a pulse-width modulator 1336 within high-frequency-path supply module 1306 arranged to provide a pulse-width modulated signal 1340. The pulse-width modulated signal 1340 is coupled to the supply 1245 of the linear amplifier 504 via a filter arrangement, for example comprising inductance 1337 and capacitance 1335 (which functions as the supply decoupling capacitor of HF power to the linear amplifier 504). In this manner, the filtered pulse-width modulated signal 1340 is attached to the high frequency supply 1245, thereby locking the supply voltage of Class-AB linear amplifier 504. In this manner, the class AB linear amplifier 504 is supplied by pulse-width modulated HF power, and its output delivers AC PA power to the PA 424 and being coupled to the PA via capacitor 1333. Again, when compared to the implementation of FIG. 8, it can be seen that the inverting amplifier 625 of FIG. 8 is effectively replaced with subtractor 1220 that extracts the DC value of coupling capacitor 1333. In this manner, the AC coupling capacitor 1333 voltage is used as a feedback to the current-mode switched mode power supply for the low frequency path and introduces no extra loop delay.

As a consequence, loop compensation can be more easily controlled as described for FIG. 12.

In FIG. 13, values for inductance 621, capacitance 1332, inductance 622, and capacitor 1333 are selected to deliver a low frequency supply power to PA 424. Inductor 621, capacitor 1332, inductance 622 and capacitance 1333 in FIG. 13 may form a $4^{th}$ order LC filter to further reduce any current ripple due to pulse mode effects on the low frequency output. By effectively shorting inductance 621 and removing the effect of capacitance 1332, inductance 622 and capacitor 1333 in the implementation of FIG. 13, it can be made to correspond to the combination of inductor 622 and capacitor 1333 of FIG. 12.

In FD mode, the operation of FIG. 13 is the same as in FIG. 12, except that inductor 621, capacitor 1322, inductance 622, and capacitance 1333 act as a $4^{th}$ order low pass filter applied to the supply voltage 528 of PA 424 to reduce any current ripple.

Figure 14:
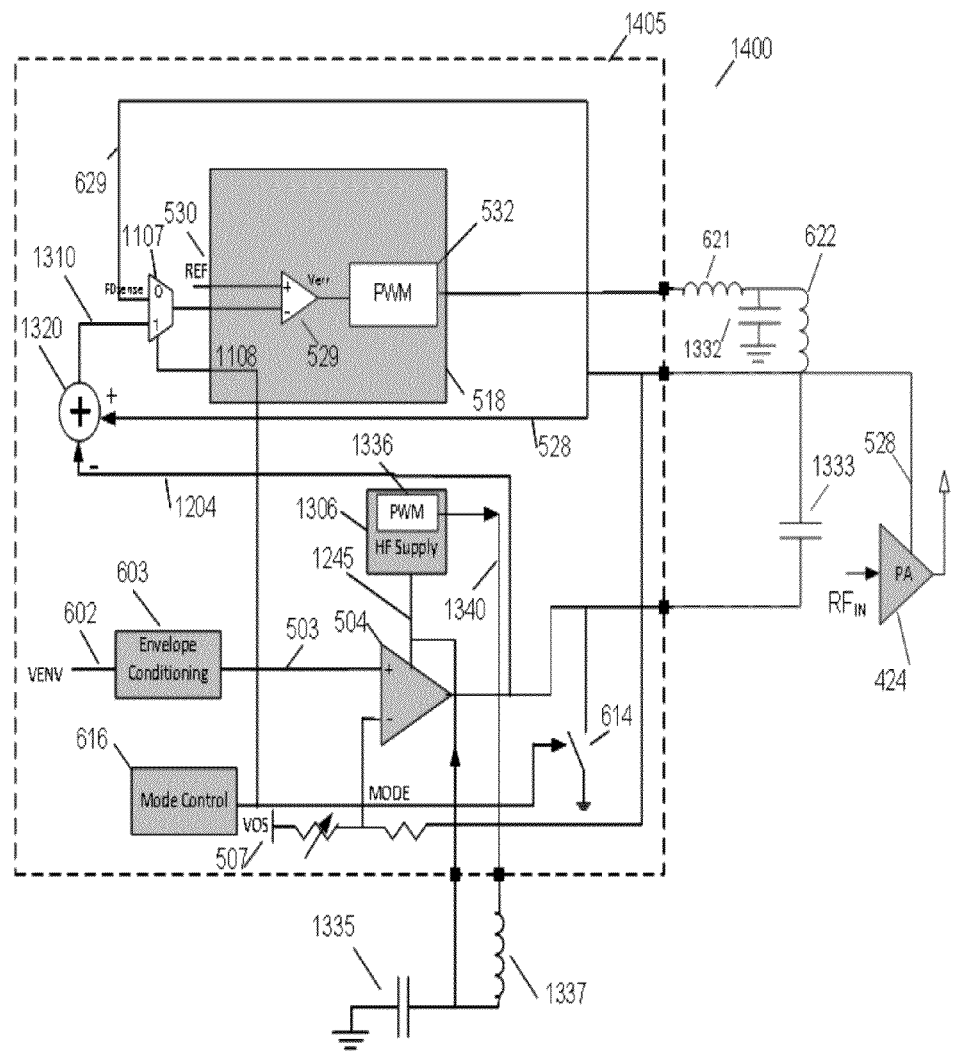
FIG. 14 illustrates a yet still even further example block diagram of a part of a power supply circuit of a transmitter chain of a wireless communication unit adapted to support envelope tracking.

Referring now to FIG. 14, a yet still even further example block diagram 1400 of a part of a power supply circuit for a PA of a transmitter chain of a wireless communication unit, adapted to support envelope tracking, is illustrated. For ease of understanding, and not to obfuscate or distract from the description of FIG. 14, electronic components and circuits of the transmitter chain described with reference to earlier figures will not be explained in any greater extent than that considered necessary. In this example, an envelope tracking module integrated circuit 1305 is illustrated, with a selected portion of input/output/control pins. A skilled artisan will appreciate that the same IC arrangement with the illustrated components and functions can be applied to the previous architecture drawings.

In FIG. 14, one example control arrangement for use in the low-frequency-path power supply 518, both in FD mode and in ET mode operates substantially in the same manner as described in FIG. 5. However, in contrast to FIG. 5, the error amplifier 529 receives an output from analog multiplexer 1107, which is fed from either an FDSense input or the output from the subtractor 1320. As such, the output voltage 1310 can be used directly as the control voltage to a pulsewidth modulator 532 in the low-frequency-path power supply 518 in order to produce the appropriate current to apply to the coupling network. The subtractor 1320 subtracts the output of the linear amplifier 504, which is powered by the PWM 1336 of the HF supply module 1306 in the same manner as FIG. 13, from the supply voltage 528 applied to the PA 424.

The function and characteristics of inductance 621, capacitor 1332, inductance 622, capacitance 1333, inductance 1337, and capacitance 1335 are similar to that described with reference to FIG. 13, in that they act as a $4^{th}$ order low pass filter applied to the supply voltage 528 of PA 424 to reduce any current ripple.

Figure 15:
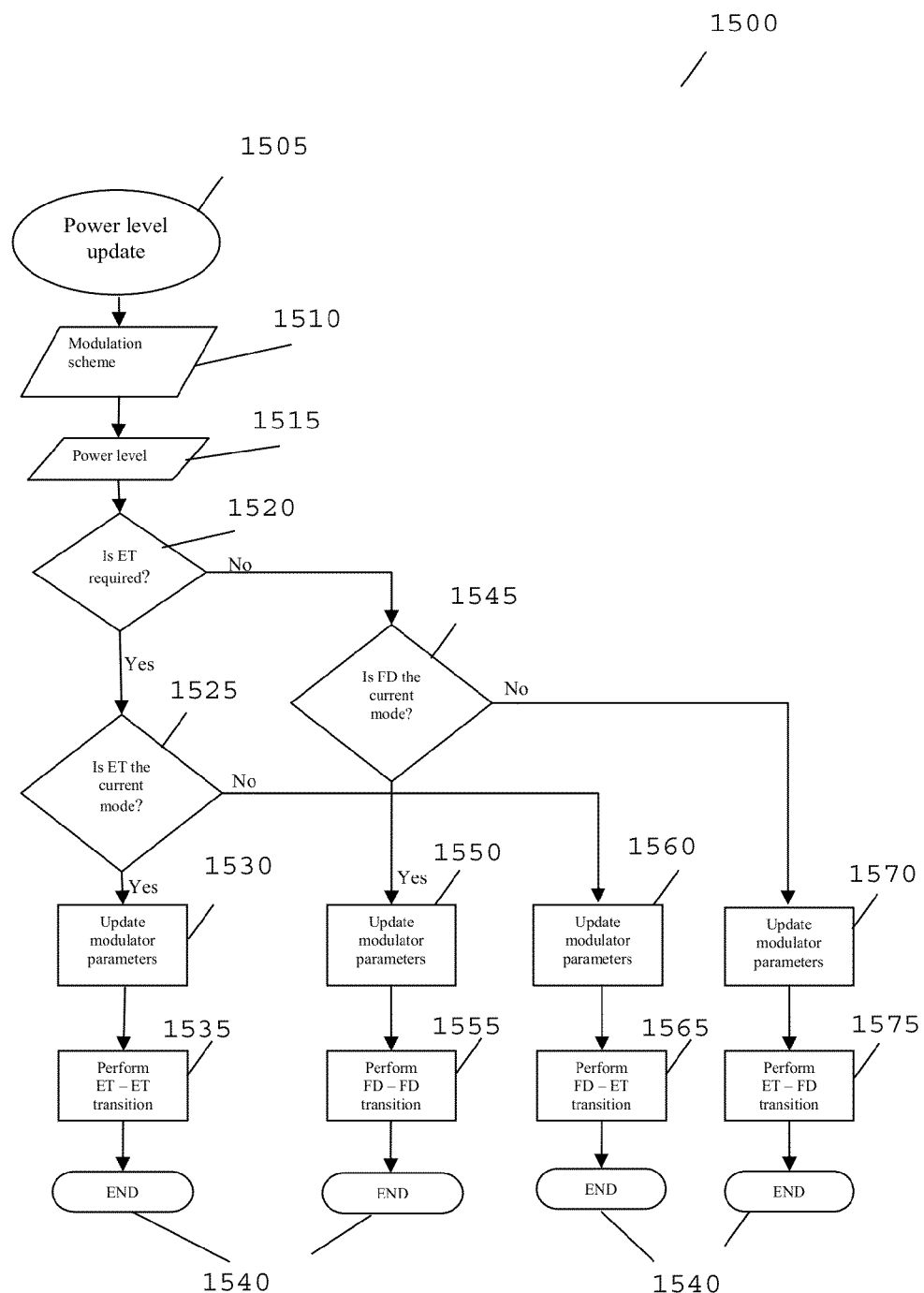
FIG. 15 illustrates an example flowchart for envelope tracking.

FIG. 15 illustrates a simplified example flowchart 1500 to support envelope tracking (ET) in a transmitter chain. The flowchart starts in step 1505 with, say, the transmitter commencing a power level update process. The transmitter starts to modulate signals for transmission using, say, a pre-determined modulation scheme in step 1510 and sets an initial radio frequency output power level of the transmitter in step 1515. A determination is then made as to whether envelope tracking is required, as shown in step 1520. If envelope tracking is beneficial or required in step 1520, then a determination is made as to whether the current mode being used is envelope tracking, as in step 1525. If the current mode of operation is envelope tracking in step 1525, one or more modulator parameters are adjusted within the transmitter chain, in step 1530, an ET to ET transition is performed in step 1535 and the process ends in step 1540.

However, if the current mode of operation is not envelope tracking, in step 1525, one or more modulator parameters are adjusted within the transmitter chain, in step 1550, a FD to ET transition is performed in step 1565, disabling FD mode and enabling ET mode, and the process ends in step 1540.

Referring back to step 1520, if the mode of operation required is not envelope tracking, a determination is made as to whether the current mode of operation is FD, as shown in step 1545. If the current mode of operation is FD, in step 1545, one or more modulator parameters are adjusted within the transmitter chain, in step 1550, a FD to FD transition is performed in step 1555 and the process ends in step 1540. However, if the current mode of operation is not FD, the modulator parameters are adjusted within the transmitter chain, in step 1570. Thereafter an ET to FD transition in step 1575 is performed, causing the envelope tracking mode of operation to be disabled and the fixed drain mode enabled, in step 1575 and the process ends in step 1540.

In some examples, some or all of the steps illustrated in the flowchart may be implemented in hardware and/or some or all of the steps illustrated in the flowchart may be implemented in software. In some examples, the aforementioned steps of FIG. 15 may be re-ordered, whilst providing the same or similar benefits.

Thus, the hereinbefore examples provide improved power supply integrated circuits, wireless communication units and methods for power amplifier supply voltage control that use such linear and efficient transmitter architectures, and in particular a wideband power supply architecture that can provide a supply voltage in power efficient manner. Advantageously, example embodiments of the invention based on an AC coupled architecture may provide improved efficiency over DC coupled solutions. For example, in a dc-coupled system where the output of the linear amplifier is directly connected to the PA supply (i.e. the output of the modulator), the output cannot exceed the supply of the linear amplifier without forward biasing diodes associated with the output devices. However, in an AC coupled system as described, the capacitor is an additional component, with an associated cost. However, the provision of two modes of operation, in the various architectures described, supports a dual-role of the coupling capacitor. The architectures allow for the coupling capacitor to function both as the filtering capacitor for the SMPS in fixed drain mode and as an AC coupling capacitor in envelope tracking mode.

Advantageously, some of the example embodiments of the invention may also provide an ability to drive loads above the power source voltage (Vbat). For example, the linear amplifier may be implemented with greater than unity gain, which allows output voltages greater than battery voltage to be mapped to inputs less than the battery voltage. The dc (average) output voltage, which is set by the compliance of the LF supply SMPS, is limited to voltages less than the battery voltage if a buck type regulator is used. However the output of the modulator is the combination (addition) of the DC and AC components. Positive AC voltages, applied at the output of the amplifier, will drive the output higher above the average level, i.e. above the battery voltage. This only works in a transient manner, the DC voltages still remains below battery voltage, and relies on the capacitor's ability to maintain a DC voltage across and act as a level shifter. The presence of an inductor between the output of the modulator and switching devices of the LF Supply SMPS is necessary to enable the voltage to momentarily exceed the battery voltage.

Advantageously, some example embodiments of the invention provide an ability to switch between an ET mode of operation and a FD mode of operation, dependent upon the prevailing operational conditions. In particular, an ability to reconfigure a SMPS power supply from an ET mode of operation to a fixed drain mode of operation, at least for a period of time, may negate or reduce a capacitance cost of the architecture, as the AC-coupling capacitor may be re-used in an FD mode of operation as a filter capacitor.

Figure 16:
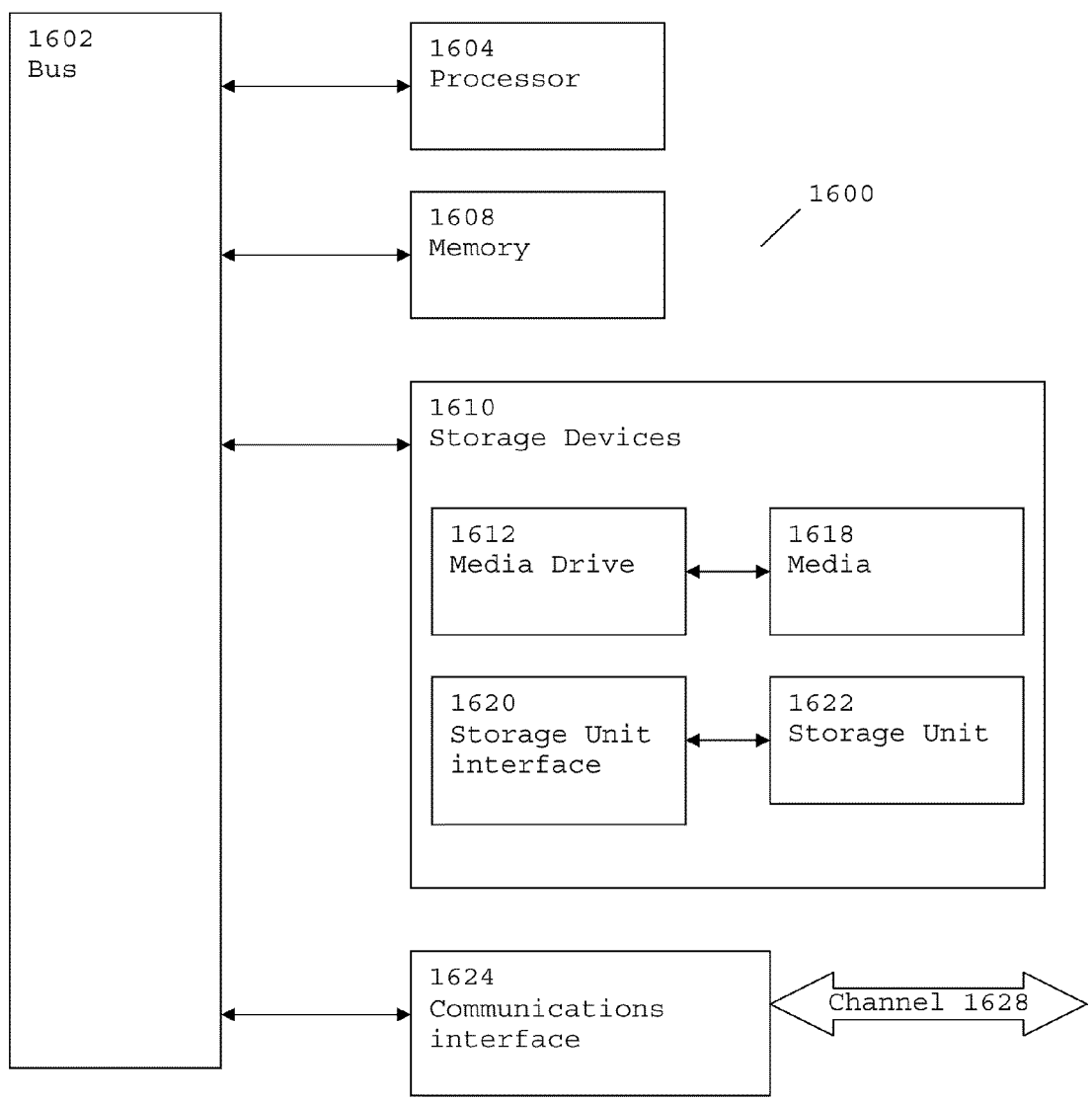
FIG. 16 illustrates a typical computing system that may be employed to implement signal processing functionality in embodiments of the invention.

Referring now to FIG. 16, there is illustrated a typical computing system 1600 that may be employed to implement signal processing functionality in embodiments of the invention. Computing systems of this type may be used in access points and wireless communication units. Those skilled in the relevant art will also recognize how to implement the invention using other computer systems or architectures. Computing system 1600 may represent, for example, any general purpose computing device as may be desirable or appropriate for a given application or environment. Computing system 1600 can include one or more processors, such as a processor 1604. Processor 1604 can be implemented using a general or special-purpose processing engine such as, for example, a microprocessor, microcontroller or other control module. In this example, processor 1604 is connected to a bus 1602 or other communications medium.

Computing system 1600 can also include a main memory 1608, such as random access memory (RAM) or other dynamic memory, for storing information and instructions to be executed by processor 1604. Main memory 1608 also may be used for storing temporary variables or other intermediate information during execution of instructions to be executed by processor 1604. Computing system 1600 may likewise include a read only memory (ROM) or other static storage device coupled to bus 1602 for storing static information and instructions for processor 1604.

The computing system 1600 may also include information storage system 1610, which may include, for example, a media drive 1612 and a removable storage interface 1620. The media drive 1612 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1618 may include, for example, a hard disk, floppy disk, magnetic tape, optical disk, CD or DVD, or other fixed or removable medium that is read by and written to by media drive 1612. As these examples illustrate, the storage media 1618 may include a computer-readable storage medium having particular computer software or data stored therein.

In alternative embodiments, information storage system 1610 may include other similar components for allowing computer programs or other instructions or data to be loaded into computing system 1600. Such components may include, for example, a removable storage unit 1622 and an interface 1620, such as a program cartridge and cartridge interface, a removable memory (for example, a flash memory or other removable memory module) and memory slot, and other removable storage units 1622 and interfaces 1620 that allow software and data to be transferred from the removable storage unit 1618 to computing system 1600.

Computing system 1600 can also include a communications interface 1624. Communications interface 1624 can be used to allow software and data to be transferred between computing system 1600 and external devices. Examples of communications interface 1624 can include a modem, a network interface (such as an Ethernet or other NIC card), a communications port (such as for example, a universal serial bus (USB) port), a PCMCIA slot and card, etc. Software and data transferred via communications interface 1624 are in the form of signals which can be electronic, electromagnetic, and optical or other signals capable of being received by communications interface 1624. These signals are provided to communications interface 1624 via a channel 1628. This channel 1628 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 1608, storage device 1618, or storage unit 1622. These and other forms of computer-readable media may store one or more instructions for use by processor 1604, to cause the processor to perform specified operations. Such instructions, generally referred to as 'computer program code' (which may be grouped in the form of computer programs or other groupings), when executed, enable the computing system 1600 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1600 using, for example, removable storage drive 1622, drive 1612 or communications interface 1624. The control module (in this example, software instructions or computer program code), when executed by the processor 1604, causes the processor 1604 to perform the functions of the invention as described herein.

In particular, it is envisaged that the aforementioned inventive concept can be applied by a semiconductor manufacturer to any integrated circuit comprising a power supply circuit for a PA. It is further envisaged that, for example, a semiconductor manufacturer may employ the inventive concept in a design of a stand-alone device, such as a power supply module, or application-specific integrated circuit (ASIC) and/or any other sub-system element. Alternatively, the examples of the invention may be embodied in discrete circuits or combination of components.

It will be appreciated that, for clarity purposes, the above description has described embodiments of the invention with reference to different functional units and processors. However, it will be apparent that any suitable distribution of functionality between different functional units or processors, for example with respect to the power supply circuitry or signal conditioning circuits or amplifier circuits may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Aspects of the invention may be implemented in any suitable form including hardware, software, firmware or any combination of these. The invention may optionally be implemented, at least partly, as computer software running on one or more data processors and/or digital signal processors or configurable module components such as field programmable gate array (FPGA) devices. Thus, the elements and components of an embodiment of the invention may be physically, functionally and logically implemented in any suitable way. Indeed, the functionality may be implemented in a single unit, in a plurality of units or as part of other functional units.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved power supply integrated circuit(s), wireless communication unit (s) and methods for power amplifier supply voltage control that use linear and efficient transmitter architectures, and in particular a wideband power supply architecture that can provide a supply voltage in power efficient manner therefor, have been described, wherein the aforementioned disadvantages with prior art arrangements have been substantially alleviated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit for providing a power supply to a radio frequency (RF) power amplifier (PA), the integrated circuit comprising:
   a low-frequency power supply path comprising a switching regulator; and
   a high-frequency power supply path arranged to regulate an output voltage of a combined power supply at an output port of the integrated circuit for coupling to a load wherein the combined power supply is provided by the low-frequency power supply path and high-frequency power supply path;
wherein the high-frequency power supply path comprises:
   an amplifier comprising a voltage feedback and arranged to drive a power supply signal on the high-frequency power supply path; and
   a high-frequency-path supply module arranged to provide a high frequency supply to drive the amplifier, where the high-frequency-path supply module comprises a pulse-width modulator operably coupled to the high frequency supply via a filter and arranged to provide a filtered pulse-width modulated signal to the high frequency supply path.

2. The integrated circuit of claim 1 wherein the amplifier is a linear amplifier comprising a first input for receiving the voltage feedback and a second input arranged to receive a modulated envelope input signal.

3. The integrated circuit of claim 1 wherein the filter is an inductance-capacitance filter with a node coupling a first inductance and first capacitance arranged to fix a dc operating point of the linear amplifier.

4. The integrated circuit of claim 1 wherein the filtered pulse-width modulated signal fixes a dc operating point of the linear amplifier.

5. The integrated circuit of claim 1 wherein the switching regulator of the low-frequency power supply path controls an average output voltage of the amplifier by use of a capacitor acting as an integrator.

6. The integrated circuit of claim 1 wherein the power supply is a hybrid wideband power supply comprising a switch mode power supply.

7. The integrated circuit of claim 1 further comprising a mode control module arranged to select between at least an envelope tracking mode of operation and a fixed drain mode of operation of the amplifier.

8. The integrated circuit of claim 7 wherein, in the fixed drain mode of operation of the amplifier, the integrated circuit further comprises a first output port coupled to the low-frequency power supply path and a second output port coupled to the amplifier for coupling to the RF PA via an inductance-capacitance network.

9. The integrated circuit of claim 8 wherein the first output port and second output port facilitate coupling a fourth-order low pass filter to the combined power supply of the RF PA.

10. The integrated circuit of claim 9 wherein a second inductance and second capacitance of the fourth-order low pass filter are arranged to reduce current ripple on a pulse width modulated signal on the low-frequency power supply path.

11. The integrated circuit of claim 1 further comprising a subtractor module operably coupled to and independent from the low-frequency power supply path and arranged to subtract an instantaneous load current at the output of the linear amplifier from the combined modulated power supply at the output port of the integrated circuit.

12. The integrated circuit of claim 10 wherein, in the envelope tracking mode of operation, a feedback signal for the low-frequency power supply path takes as its input the output of the subtractor module.

13. The integrated circuit of claim 11 wherein the output of the subtractor module is input to a summing junction arranged to sum the output of the subtractor module with a sensed output of the linear amplifier.

14. The integrated circuit of claim 12 wherein the sensed output of the linear amplifier is converted to voltage by a current to voltage converter before being input to the summing junction.

15. The integrated circuit of claim 10 wherein the instantaneous load current at the output of the linear amplifier comprises a slowly-varying term that reflects an integrated difference between the output voltage of the linear amplifier and a desired value.

16. The integrated circuit of claim 10 wherein the low-frequency power supply path comprises a pulse width modulator arranged to respond to a control signal output from the subtractor module to produce a low frequency output current.

17. The integrated circuit of claim 10 wherein the low-frequency power supply path comprises a comparator having an output that provides the combined power supply at the output port of the integrated circuit and a first input connected to an analog multiplexer arranged to multiplex an output from the subtractor module with a sensed output current from the comparator output.

18. A wireless communication unit comprising a radio frequency (RF) power amplifier (PA) and a power supply for providing a power supply to the RF PA, the wireless communication unit comprising:
  a low-frequency power supply path comprising a switching regulator; and
  a high-frequency power supply path arranged to regulate an output voltage of a combined power supply for coupling to a load wherein the combined power supply is provided by the low-frequency power supply path and high-frequency power supply path;
wherein the high-frequency power supply path comprises:
  an amplifier comprising a voltage feedback and arranged to drive a power supply signal on the high-frequency power supply path; and
  a high-frequency-path supply module arranged to provide a high frequency supply to drive the amplifier, where the high-frequency-path supply module comprises a pulse-width modulator operably coupled to the high frequency supply via a filter and arranged to provide a filtered pulse-width modulated signal to the high frequency supply.

19. A wireless communication unit comprising a radio frequency (RF) power amplifier (PA) and a power supply for providing a power supply to the RF PA, the wireless communication unit comprising:
  a low-frequency power supply path comprising a switching regulator; and
  a high-frequency power supply path comprising an amplifier coupled to a load through a capacitor;
wherein the output of the low-frequency power supply path is controlled according to an output of the amplifier coupled to one end of the capacitor and a combined modulated power supply provided by the low-frequency power supply path and high-frequency power supply path coupled to another end of the capacitor.

20. The wireless communication unit of claim 19 further comprising a subtractor module operably coupled to the low-frequency power supply path and arranged to subtract an instantaneous load current at the output of the amplifier from the combined modulated power supply provided by the low-frequency power supply path and high-frequency power supply path.

21. The wireless communication unit of claim 20 wherein, in the envelope tracking mode of operation, a feedback signal for the low-frequency power supply path takes as its input the output of the subtractor module.

22. The wireless communication unit of claim 20 wherein the output of the subtractor module is input to a summing junction arranged to sum the output of the subtractor module with a sensed output of the amplifier.

23. The wireless communication unit of claim 22 wherein the sensed output of the linear amplifier is converted to voltage by a current to voltage converter before being input to the summing junction.

24. The wireless communication unit of claim 20 wherein the instantaneous load current at the output of the amplifier comprises a slowly-varying term that reflects an integrated difference between the output voltage of the amplifier and a desired value.

25. The wireless communication unit of claim 20 wherein the low-frequency power supply path comprises a pulse width modulator arranged to respond to a control signal output from the subtractor module to produce a low frequency output current.

26. The wireless communication unit of claim 19 wherein a voltage of the capacitor is tended to be equal to a desired reference value.

27. The wireless communication unit of claim 19 wherein an instantaneous output current of the amplifier is tended to be zero by supplying more current through the low-frequency path when the output current of the amplifier is high.

* * * * *